US012676112B2

(12) United States Patent
Wang et al.

(10) Patent No.: US 12,676,112 B2
(45) Date of Patent: Jul. 7, 2026

(54) DISPLAY SUBSTRATE AND DISPLAY DEVICE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Haitao Wang, Beijing (CN); Tongshang Su, Beijing (CN); Jun Wang, Beijing (CN); Yongchao Huang, Beijing (CN); Jun Cheng, Beijing (CN)

(73) Assignees: HEFEI XINSHENG OPTOELECTRONICS CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 321 days.

(21) Appl. No.: 18/697,362

(22) PCT Filed: Jul. 31, 2023

(86) PCT No.: PCT/CN2023/110232
§ 371 (c)(1),
(2) Date: Mar. 29, 2024

(87) PCT Pub. No.: WO2025/025058
PCT Pub. Date: Feb. 6, 2025

(65) Prior Publication Data
US 2026/0141848 A1 May 21, 2026

(51) Int. Cl.
*G09G 3/3233* (2016.01)
*H10K 59/131* (2023.01)
(52) U.S. Cl.
CPC ......... *G09G 3/3233* (2013.01); *H10K 59/131* (2023.02); *G09G 2300/0804* (2013.01);
(Continued)

(58) Field of Classification Search
CPC ......... G09G 3/3233; G09G 2300/0804; G09G 2300/0852; G09G 2320/0233;
(Continued)

(56) References Cited

U.S. PATENT DOCUMENTS 11,877,482 B2 * 1/2024 Yuan .................... H10K 59/131
12,167,654 B2 * 12/2024 Long .................... H10K 59/131
(Continued)

FOREIGN PATENT DOCUMENTS

CN 112909065 A * 6/2021 ............. H10D 1/692
CN 114171564 A * 3/2022 ............. H10D 86/60

OTHER PUBLICATIONS

Machine translation of CN-114171564-A (Year: 2026).*

*Primary Examiner* — Michael Pervan
(74) *Attorney, Agent, or Firm* — Kinney & Lange, P.A.

(57) ABSTRACT

A display substrate includes: a base substrate; pixel units; and a first scanning signal line, a data line, and a sensing signal line on the base substrate. The first scanning signal line includes first sub scanning signal lines; two adjacent first sub scanning signal lines are spaced in a first region; the sensing signal line and the data line extend in the second direction; orthographic projections of the sensing signal line and the data line on the base substrate do not overlap an orthographic projection of the first sub scanning signal lines on the base substrate, and extend through an orthographic projection of the first region on the base substrate. The first sub scanning signal line and the first gate are spaced in the second direction, and the fourth sub scanning signal line and the third gate are spaced in the second direction.

20 Claims, 11 Drawing Sheets

(52) U.S. Cl.
CPC .............. *G09G 2300/0852* (2013.01); *G09G 2320/0233* (2013.01); *G09G 2320/0242* (2013.01); *G09G 2330/04* (2013.01); *G09G 2330/06* (2013.01); *G09G 2360/148* (2013.01)

(58) Field of Classification Search
CPC ....... G09G 2320/0242; G09G 2330/04; G09G 2330/06; G09G 2360/148; H10K 59/131
See application file for complete search history.

(56) References Cited

U.S. PATENT DOCUMENTS

| | | | | |
|---|---|---|---|---|
| 12,183,276 | B2 * | 12/2024 | Wang .................... | G09G 3/3233 |
| 12,364,122 | B2 * | 7/2025 | Yuan .................... | G09G 3/3233 |
| 2018/0047336 | A1 * | 2/2018 | Chen .................... | G09G 3/3266 |
| 2021/0225289 | A1 * | 7/2021 | Wang .................... | G09G 3/3291 |
| 2023/0048918 | A1 * | 2/2023 | Long .................... | H10K 59/121 |
| 2023/0095733 | A1 * | 3/2023 | Yuan .................... | H10K 59/131 |
| | | | | 345/206 |
| 2023/0138949 | A1 * | 5/2023 | Wang ................. | H10K 59/1213 |
| | | | | 257/71 |
| 2023/0345763 | A1 * | 10/2023 | Feng ................. | H10K 59/1213 |
| 2024/0203342 | A1 * | 6/2024 | Wang .................... | G09G 3/3233 |
| 2025/0063910 | A1 * | 2/2025 | Long .................... | H10K 59/131 |

* cited by examiner

DISPLAY SUBSTRATE AND DISPLAY DEVICE

CROSS REFERENCE TO RELATED APPLICATION(S)

This application is a Section 371 National Stage Application of International Application No. PCT/CN2023/110232, filed on Jul. 31, 2023, entitled "DISPLAY SUBSTRATE AND DISPLAY DEVICE," the disclosure of which is incorporated by reference herein.

TECHNICAL FIELD

The present disclosure relates to a field of display technology, and in particular, to a display substrate and a display device.

BACKGROUND

Organic Light-Emitting Diode (OLED) devices have attracted much attention due to their advantages of self-illumination, rich color, fast response speed, wide viewing angle, light weight, thin thickness, low power consumption, and flexible display, which are now widely used in mobile phones, televisions, and wearable devices. With the development of OLED technology, the size of OLED display panels is getting larger, and the requirements for resolution and brightness are getting higher, which puts forward higher requirements for the design of driving circuits for the OLED display panels.

In existing designs, electrostatic breakdown is prone to occur in an overlapping region of a gate layer and an active layer or a source/drain layer, resulting in a short circuit of a pixel driving circuit and poor display. How to design and optimize the driving circuit of the OLED display panels to improve the quality and yield of OLED display products is one of the important research topics for R&D personnel.

It should be noted that the information disclosed in the background technology section above is only intended to enhance the understanding of the background of the present disclosure, and thus may include information that does not constitute a related art known to those skilled in the art.

SUMMARY

In an aspect, a display substrate is provided, including: a base substrate; a plurality of pixel units on the base substrate, wherein each of the plurality of pixel units includes a plurality of sub-pixels, the plurality of pixel units are arranged in an array in a first direction and a second direction on the base substrate, at least one of the plurality of sub-pixels includes a light-emitting element and a pixel driving circuit used to drive the light-emitting element, the pixel driving circuit includes a switching transistor and a sensing transistor, the switching transistor includes a first gate, the sensing transistor includes a third gate, and the first direction intersects with the second direction; a first scanning signal line on the base substrate, wherein the first scanning signal line is used to supply a first scanning signal to a plurality of pixel units arranged in the first direction; a second scanning signal line on the base substrate, wherein the second scanning signal line is used to supply a second scanning signal to a plurality of pixel units arranged in the first direction; at least one data line on the base substrate, wherein the at least one data line is used to supply a data signal to a plurality of pixel units arranged in the second direction, and the at least one data line extends in the second direction; and a sensing signal line on the base substrate, wherein the sensing signal line is used to supply a sensing signal to the plurality of pixel units arranged in the second direction, and the sensing signal line extends in the second direction, wherein the first scanning signal line includes a plurality of first sub scanning signal lines, the plurality of first sub scanning signal lines extend in the first direction; and the second scanning signal line includes a plurality of fourth sub scanning signal lines, and the plurality of fourth sub scanning signal lines extend in the first direction, wherein two adjacent first sub scanning signal lines are spaced in a first region, an orthographic projection of the sensing signal line on the base substrate and an orthographic projection of the at least one data line on the base substrate do not overlap with an orthographic projection of the plurality of first sub scanning signal lines on the base substrate, and the orthographic projection of the sensing signal line on the base substrate and the orthographic projection of the at least one data line on the base substrate extend through an orthographic projection of the first region on the base substrate; and two adjacent fourth sub scanning signal lines are spaced in a second region, the orthographic projection of the sensing signal line on the base substrate and the orthographic projection of the at least one data line on the base substrate do not overlap with an orthographic projection of the plurality of fourth sub scanning signal lines on the base substrate, and the orthographic projection of the sensing signal line on the base substrate and the orthographic projection of the at least one data line on the base substrate extend through an orthographic projection of the second region on the base substrate, and wherein the first sub scanning signal line and the first gate are spaced in the second direction; and the fourth sub scanning signal line and the third gate are spaced in the second direction.

According to some exemplary embodiments, the display substrate further includes a first scanning signal conversion portion on the base substrate, and the first scanning signal conversion portion extends in the second direction; and wherein the first sub scanning signal line is electrically connected to the first gate at least through the first scanning signal conversion portion, and the first scanning signal conversion portion and the first sub scanning signal line are in different layers; and/or, the first scanning signal conversion portion and the first gate are in different layers.

According to some exemplary embodiments, the display substrate further includes a fourth scanning signal conversion portion on the base substrate, and the fourth scanning signal conversion portion extends in the second direction; wherein the fourth sub scanning signal line is electrically connected to the third gate at least through the fourth scanning signal conversion portion, and the fourth scanning signal conversion portion and the fourth sub scanning signal line are in different layers; and/or, the fourth scanning signal conversion portion and the third gate are in different layers.

According to some exemplary embodiments, the first scanning signal line further includes a second sub scanning signal line, the second sub scanning signal line extends in the first direction, and the second sub scanning signal line and the first sub scanning signal line are spaced in the second direction; the display substrate further includes a first scanning signal conversion portion on the base substrate, wherein the first scanning signal conversion portion extends in the second direction; and wherein the first sub scanning signal line is electrically connected to the second sub scanning signal line through the first scanning signal conversion portion.

According to some exemplary embodiments, the first scanning signal line further includes a third sub scanning signal line, the third sub scanning signal line extends in the first direction, and the third sub scanning signal line and the first sub scanning signal line are spaced in the second direction; and wherein the first sub scanning signal line is electrically connected to the third sub scanning signal line through the first scanning signal conversion portion.

According to some exemplary embodiments, the second scanning signal line further includes a plurality of fifth sub scanning signal lines, and the plurality of fifth sub scanning signal lines extend in the first direction; wherein the display substrate further includes: a second power signal line on the base substrate, the second power signal line is used to supply a second power signal to the plurality of pixel units arranged in the second direction, and the second power signal line extends in the second direction; and wherein adjacent fourth and fifth sub scanning signal lines are spaced in a third region, an orthographic projection of the second power signal line on the base substrate does not overlap with an orthographic projection of the plurality of fourth sub scanning signal lines on the base substrate, the orthographic projection of the second power signal line on the base substrate does not overlap with an orthographic projection of the plurality of fifth sub scanning signal lines on the base substrate, and the orthographic projection of the second power signal line on the base substrate extends through an orthographic projection of the third region on the base substrate.

According to some exemplary embodiments, the display substrate further includes: a first power signal line on the base substrate, the first power signal line is used to supply a first power signal to the plurality of pixel units arranged in the second direction, and the first power signal line extends in the second direction; and wherein adjacent fourth and fifth sub scanning signal lines are spaced in a fourth region, an orthographic projection of the first power signal line on the base substrate does not overlap with the orthographic projection of the plurality of fourth sub scanning signal lines on the base substrate, the orthographic projection of the first power signal line on the base substrate does not overlap with the orthographic projection of the plurality of fifth sub scanning signal lines on the base substrate, and the orthographic projection of the first power signal line on the base substrate extends through an orthographic projection of the fourth region on the base substrate.

According to some exemplary embodiments, the plurality of fifth sub scanning signal lines are between two adjacent fourth sub scanning signal lines, the plurality of fifth sub scanning signal lines between the two adjacent fourth sub scanning signal lines are spaced in the second region, and the orthographic projection of the sensing signal line on the base substrate and the orthographic projection of the at least one data line on the base substrate do not overlap with the orthographic projection of the plurality of fifth sub scanning signal lines on the base substrate.

According to some exemplary embodiments, the second scanning signal line further includes a sixth sub scanning signal line, the sixth sub scanning signal line extends in the first direction, and the sixth sub scanning signal line and the fourth sub scanning signal line are spaced in the second direction; wherein the display substrate further includes a third scanning signal conversion portion on the base substrate, and the third scanning signal conversion portion extends in the second direction; and wherein the fourth sub scanning signal line is electrically connected to the sixth sub scanning signal line through the third scanning signal conversion portion.

According to some exemplary embodiments, the display substrate further includes a fourth scanning signal conversion portion on the base substrate, and the fourth scanning signal conversion portion extends in the second direction; and the sixth sub scanning signal line is electrically connected to the fifth sub scanning signal line through the fourth scanning signal conversion portion.

According to some exemplary embodiments, at least one of the plurality of pixel units includes a first sub-pixel, a second sub-pixel, a third sub-pixel, and a fourth sub-pixel, the first sub-pixel is in a $i^{th}$ row and a $j^{th}$ column, the second sub-pixel is in a $(i+1)^{th}$ row and the $j^{th}$ column, the third sub-pixel is in the $i^{th}$ row and a $(j+1)^{th}$ column, the fourth sub-pixel is in a $(i+1)^{th}$ row and the $(j+1)^{th}$ column, and both i and j are positive integers greater than or equal to 1; and wherein in the second direction, the first sub scanning signal line, the second sub scanning signal line, the third sub scanning signal line, the fourth scanning signal line, the fifth scanning signal line, and the sixth scanning signal line used to supply scanning signals to sub-pixels in the $i^{th}$ row and sub-pixels in the $(i+1)^{th}$ row are between the sub-pixels in the $i^{th}$ row and the sub-pixels in the $(i+1)^{th}$ row.

According to some exemplary embodiments, each sub-pixel includes a light-emitting element and a pixel driving circuit for driving the light-emitting element, the pixel driving circuit at least includes a switching transistor, and the switching transistor includes a first active layer; and an orthographic projection of the second sub scanning signal line on the base substrate partially overlaps with an orthographic projection of a first active layer of the first sub-pixel on the base substrate and an orthographic projection of a first active layer of the third sub-pixel on the base substrate, and a part of the second sub scanning signal line overlapping with the first active layer of the first sub-pixel and a part of the second sub scanning signal line overlapping with the first active layer of the third sub-pixel form a first gate of a switching transistor of the first sub-pixel and a first gate of a switching transistor of the third sub-pixel, respectively.

According to some exemplary embodiments, an orthographic projection of the third sub scanning signal line on the base substrate partially overlaps with an orthographic projection of a first active layer of the second sub-pixel on the base substrate and an orthographic projection of a first active layer of the fourth sub-pixel on the base substrate, and a part of the third sub scanning signal line overlapping with the first active layer of the second sub-pixel and a part of the third sub scanning signal line overlapping with the first active layer of the fourth sub-pixel form a first gate of a switching transistor of the second sub-pixel and a first gate of a switching transistor of the fourth sub-pixel, respectively.

According to some exemplary embodiments, one of the two adjacent first sub scanning signal lines is electrically connected to a first end of a second sub scanning signal line and a first end of a third sub scanning signal line through the first scanning signal conversion portion; and/or, wherein the display substrate further includes a second scanning signal conversion portion on the base substrate, the second scanning signal conversion portion extends in the second direction, and the other of the two adjacent first sub scanning signal lines is electrically connected to a second end of the second sub scanning signal line and a second end of the third sub scanning signal line through the second scanning signal conversion portion.

According to some exemplary embodiments, the pixel driving circuit further includes a sensing transistor, and the sensing transistor includes a third active layer; an orthographic projection of one of two adjacent fifth sub scanning signal lines on the base substrate partially overlaps with an orthographic projection of a third active layer of a first sub-pixel on the base substrate, an orthographic projection of the other of the two adjacent fifth sub scanning signal lines on the base substrate partially overlaps with an orthographic projection of a third active layer of a third sub-pixel on the base substrate, and a part of the fifth sub scanning signal line overlapping with the third active layer of the first sub-pixel and a part of the fifth sub scanning signal line overlapping with the third active layer of the third sub-pixel form a third gate of a sensing transistor of the first sub-pixel and a third gate of a sensing transistor of the third sub-pixel, respectively.

According to some exemplary embodiments, an orthographic projection of a sixth sub scanning signal line on the base substrate partially overlaps with an orthographic projection of a third active layer of a second sub-pixel on the base substrate and an orthographic projection of a third active layer of a fourth sub-pixel on the base substrate, and a part of the sixth sub scanning signal line overlapping with the third active layer of the second sub-pixel and a part of the sixth sub scanning signal line overlapping with the third active layer of the fourth sub-pixel form a third gate of a sensing transistor of the second sub-pixel and a third gate of a sensing transistor of the fourth sub-pixel, respectively.

According to some exemplary embodiments, the display substrate further includes a fifth scanning signal conversion portion and a sixth scanning signal conversion portion on the base substrate, and the fifth scanning signal conversion portion and the sixth scanning signal conversion portion extend in the second direction; wherein a first end of a third scanning signal conversion portion is electrically connected to the fourth sub scanning signal line, and a second end of the third scanning signal conversion portion is electrically connected to a first end of the sixth sub scanning signal line; wherein a first end of a fourth scanning signal conversion portion is electrically connected to a first middle part of the sixth sub scanning signal line, and a second end of the fourth scanning signal conversion portion is electrically connected to a first end of the fifth sub scanning signal line; wherein a first end of the fifth scanning signal conversion portion is electrically connected to a second middle part of the sixth sub scanning signal line, and a second end of the fifth scanning signal conversion portion is electrically connected to a first end of another fifth sub scanning signal line; and wherein a first end of the sixth scanning signal conversion portion is electrically connected to another fourth sub scanning signal line, and a second end of the sixth scanning signal conversion portion is electrically connected to a second end of the sixth sub scanning signal line.

According to some exemplary embodiments, in the second direction, the second sub scanning signal line is between the sub-pixels in the $i^{th}$ row and the first sub scanning signal line; and/or, wherein in the second direction, the third sub scanning signal line is between the first sub scanning signal line and the sub-pixels in the $(i+1)^{th}$ row; and/or, wherein in the second direction, the fourth sub scanning signal line is between the first sub scanning signal line and the sub-pixels in the $(i+1)^{th}$ row; and/or, wherein in the second direction, the fourth sub scanning signal line is aligned with the fifth sub scanning signal line; and/or wherein in the second direction, the sixth sub scanning signal line is between the fourth sub scanning signal line and the third sub scanning signal line.

According to some exemplary embodiments, in the first direction, a first scanning signal conversion portion is between a third scanning signal conversion portion and the fourth scanning signal conversion portion; and/or, wherein in the first direction, the fourth scanning signal conversion portion is between the first scanning signal conversion portion and the data line; and/or, wherein in the first direction, a fifth scanning signal conversion portion is between another data line and a second scanning signal conversion portion; and/or, wherein in the first direction, a sixth scanning signal conversion portion is on a side of a first power signal line away from the second scanning signal conversion portion.

According to some exemplary embodiments, the orthographic projection of the sensing signal line on the base substrate and the orthographic projection of the at least one data line on the base substrate overlap with an orthographic projection of at least one second sub scanning signal line on the base substrate; and/or, wherein the orthographic projection of the sensing signal line on the base substrate and the orthographic projection of the at least one data line on the base substrate overlap with an orthographic projection of at least one third sub scanning signal line on the base substrate.

According to some exemplary embodiments, the orthographic projection of the sensing signal line on the base substrate and the orthographic projection of the at least one data line on the base substrate overlap with an orthographic projection of at least one sixth sub scanning signal line on the base substrate.

According to some exemplary embodiments, the display substrate includes: a semiconductor layer on the base substrate, wherein the first active layer and the third active layer are in the semiconductor layer; a second conductive layer on a side of the semiconductor layer away from the base substrate; and a third conductive layer on a side of the second conductive layer away from the base substrate, wherein the first sub scanning signal line, a second sub scanning signal line, a third sub scanning signal line, a fourth scanning signal line, a fifth scanning signal line, and a sixth scanning signal line are in the second conductive layer, and a first scanning signal conversion portion, a second scanning signal conversion portion, a third scanning signal conversion portion, a fourth scanning signal conversion portion, a fifth scanning signal conversion portion, and a sixth scanning signal conversion portion are in the third conductive layer.

According to some exemplary embodiments, the display substrate further includes a first conductive portion in the second conductive layer, the pixel driving circuit further includes a driving transistor, the driving transistor includes a second active layer, an orthographic projection of the first conductive portion on the base substrate partially overlaps with an orthographic projection of the second active layer on the base substrate, and a part of the first conductive portion overlapping with the second active layer forms a second gate of the driving transistor; and wherein the display substrate further includes a first conductive conversion portion in the third conductive layer and a first power signal conversion portion in the second conductive layer, a first end of the first power signal conversion portion is electrically connected to the first power signal line, a second end of the first power signal conversion portion is electrically connected to a first end of the first conductive conversion portion, and a second end of the first conductive conversion portion is electrically connected to a first end of the second active layer.

According to some exemplary embodiments, the display substrate further includes a second conductive conversion portion in the third conductive layer, a first end of the second conductive conversion portion is electrically connected to the first conductive portion, a second end of the second conductive conversion portion is electrically connected to a first end of the first active layer, and a second end of the first active layer is electrically connected to the data line.

According to some exemplary embodiments, the display substrate further includes a second conductive portion in the third conductive layer, the second conductive portion includes a conductive main body portion, a first conductive connection portion, and a second conductive connection portion, and the first conductive connection portion and the second conductive connection portion protrude outward and extend from the conductive main body portion; and wherein the first conductive connection portion is electrically connected to a second end of the second active layer, and the second conductive connection portion is electrically connected to a first end of the third active layer.

According to some exemplary embodiments, the display substrate further includes a first conductive layer on a side of the semiconductor layer facing the base substrate; the display substrate further includes a sensing signal conversion portion in the first conductive layer, the sensing signal conversion portion extends in the first direction, and an orthographic projection of the sensing signal conversion portion on the base substrate partially overlaps with the orthographic projection of the sensing signal line on the base substrate.

According to some exemplary embodiments, a third active layer of a sensing transistor of a first sub-pixel and a third active layer of a sensing transistor of a second sub-pixel are connected to form an integrated third active layer, and the integrated third active layer extends in the second direction; and wherein the display substrate further includes a third conductive conversion portion in the third conductive layer, the sensing signal line is electrically connected to the sensing signal conversion portion, a first end of the sensing signal conversion portion is electrically connected to a first end of the third conductive conversion portion, and a second end of the third conductive conversion portion is electrically connected to a middle part of the third active layer.

According to some exemplary embodiments, the pixel driving circuit further includes a storage capacitor, the storage capacitor includes a first capacitor and a second capacitor, and the second capacitor is connected in parallel with the first capacitor; and wherein the display substrate further includes a third conductive portion in the first conductive layer, orthographic projections of any two of the first conductive portion, the second conductive portion, and the third conductive portion on the base substrate at least partially overlap, the second conductive portion is electrically connected to the third conductive portion, an overlapping part of the first conductive portion and the second conductive portion forms the first capacitor, and an overlapping part of the first conductive portion and the third conductive portion forms the second capacitor.

In another aspect, a display device is provided, including the display substrate as described in any one of the preceding items.

BRIEF DESCRIPTION OF THE DRAWINGS

The above and other objects, features, and advantages of the present disclosure will become more clear through following description on embodiments of the present disclosure with reference to accompanying drawings, in which:

FIGS. 4 to 8 show plan views of one or more film layers shown in FIG. 3, respectively, wherein, FIG. 4 shows a part of a first conductive layer 1;

FIG. 5 shows a part of a first conductive layer 1 and a part of a semiconductor layer 8;

FIG. 6 shows a part of a second conductive layer 2;

FIG. 7 shows a part of a second conductive layer 2, a part of a first conductive layer 1, and a part of a semiconductor layer 8;

FIG. 8 shows a part of a third conductive layer 3;

Figure 1:
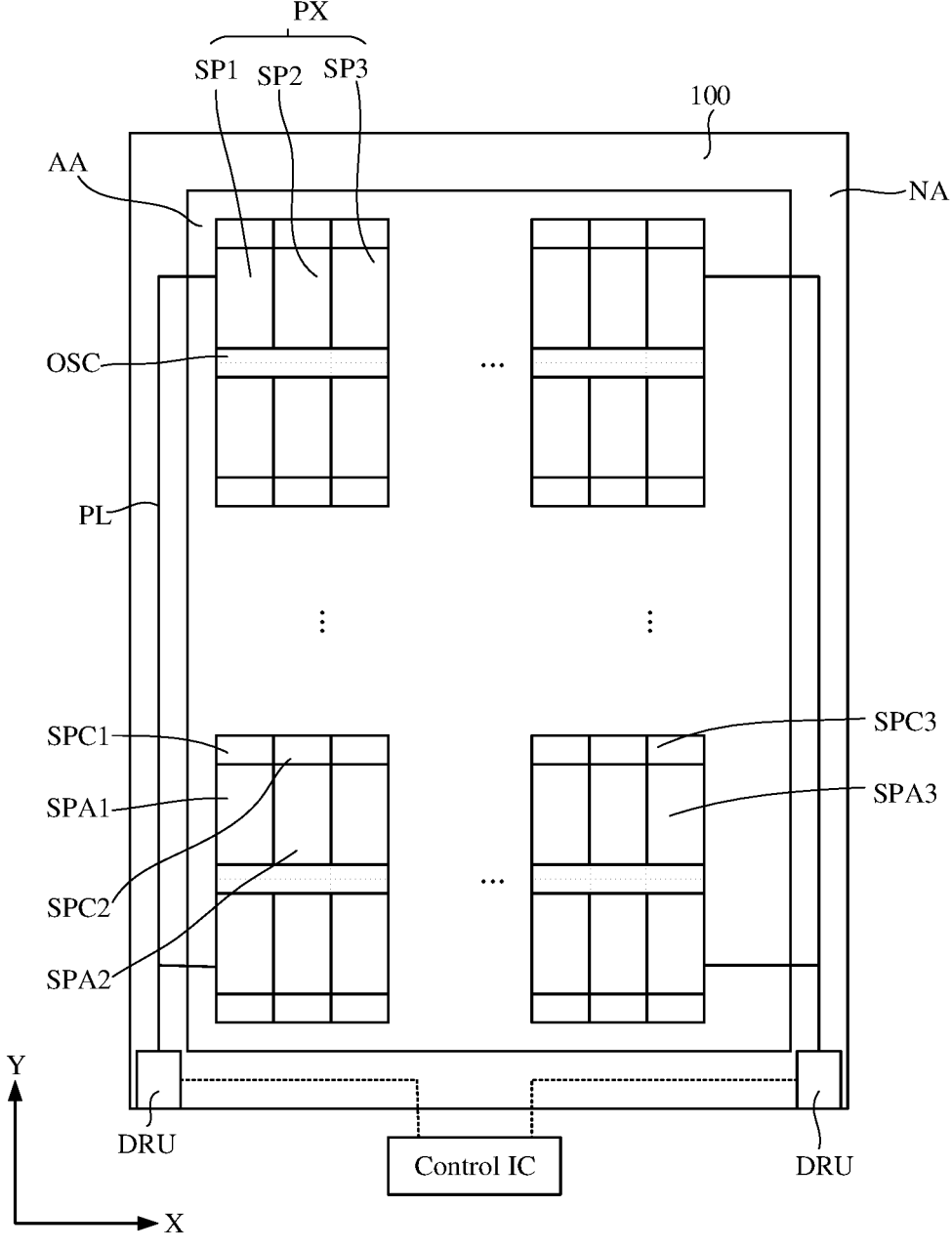
FIG. 1 shows a planar schematic diagram of a display substrate according to an embodiment of the present disclosure.

It should be noted that for clarity, the dimensions of layers, structures, or regions may be enlarged or reduced in the drawings used to describe embodiments of the present disclosure, that is, these drawings are not drawn to actual proportions.

DETAILED DESCRIPTION OF EMBODIMENTS

In order to make the purposes, technical solutions, and advantages of embodiments of the present disclosure clearer, the following will provide a clear and complete description of the technical solution of embodiments of the present disclosure in conjunction with the accompanying drawings of embodiments of the present disclosure. Obviously, the described embodiments are a part of embodiments of the present disclosure, rather than the entire embodiments. Based on the described embodiments of the present disclosure, all other embodiments obtained by those ordinary skilled in the art without the need for creative labor fall within the scope of protection of the present disclosure.

It should be noted that in the accompanying drawings, for clarity and/or descriptive purposes, the dimensions and relative dimensions of the elements may be enlarged. In this way, the dimensions and relative dimensions of each element need not be limited to the dimensions and relative dimensions shown in the figures. In the specification and drawings, the same or similar reference numbers indicate the same or similar components.

Unless otherwise defined, technical or scientific terms used in the present disclosure shall have the usual meaning understood by those ordinary skilled in the art. The terms "first", "second", and similar terms used in the present disclosure do not indicate any order, quantity, or importance, but are only used to distinguish different components. Words such as "including" or "containing" refer to elements or objects that appear before the word include elements or objects and their equivalents listed after the word, without excluding other elements or objects.

In the specification, unless otherwise specified, directional terms such as "up", "down", "left", "right", "inside", "outside" are used to represent orientation or positional relationships based on the drawings, only for the purpose of describing the present disclosure, and not to indicate or imply that the device, element or component referred to must have a specific orientation, be constructed or operated in a specific orientation. It should be understood that when the absolute position of the described object changes, the relative positional relationship it represents may also change accordingly. Therefore, these directional terms cannot be understood as limitations on the present disclosure.

It should be noted that in the specification, the term "same layer" refers to a layer structure formed by using the same film-forming process to form a film layer with a specific pattern, followed by patterning the film layer through a single patterning process using the same mask. Depending on the specific shape, the single patterning process may include multiple exposure, development, or etching processes, and the specific shape in the formed layer structure may be continuous or discontinuous. That is, a plurality of elements, components, structures, and/or parts located in the "same layer" are composed of the same material and formed through the same patterning process. Typically, the plurality of elements, components, structures, and/or parts located in the "same layer" have substantially the same thickness.

Those skilled in the art should understand that in the specification, unless otherwise specified, the term "height" or "thickness" refers to the dimensions along the surface of each film layer provided perpendicular to the display substrate, that is, the dimensions in the direction of light output of the display substrate, or the dimensions in the normal direction of the display device.

In the specification, directional expressions such as "first direction" and "second direction" are used to describe different directions along pixel units, such as the vertical and horizontal directions of pixel units, or the row and column directions of sub-pixel arrangements. It should be understood that such representation is only an illustrative description and not a limitation on the present disclosure.

Some exemplary embodiments of the present disclosure provide a display substrate, including: a base substrate; a plurality of pixel units on the base substrate, wherein each of the plurality of pixel units includes a plurality of sub-pixels, the plurality of pixel units are arranged in an array in a first direction and a second direction on the base substrate, at least one of the plurality of sub-pixels includes a light-emitting element and a pixel driving circuit used to drive the light-emitting element, the pixel driving circuit includes a switching transistor and a sensing transistor, the switching transistor includes a first gate, the sensing transistor includes a third gate, and the first direction intersects with the second direction; a first scanning signal line on the base substrate, wherein the first scanning signal line is used to supply a first scanning signal to a plurality of pixel units arranged in the first direction; a second scanning signal line on the base substrate, wherein the second scanning signal line is used to supply a second scanning signal to a plurality of pixel units arranged in the first direction; at least one data line on the base substrate, wherein the at least one data line is used to supply a data signal to a plurality of pixel units arranged in the second direction, and the at least one data line extends in the second direction; and a sensing signal line on the base substrate, wherein the sensing signal line is used to supply a sensing signal to the plurality of pixel units arranged in the second direction, and the sensing signal line extends in the second direction, wherein the first scanning signal line includes a plurality of first sub scanning signal lines, the plurality of first sub scanning signal lines extend in the first direction; and the second scanning signal line includes a plurality of fourth sub scanning signal lines, and the plurality of fourth sub scanning signal lines extend in the first direction, wherein two adjacent first sub scanning signal lines are spaced in a first region, an orthographic projection of the sensing signal line on the base substrate and an orthographic projection of the at least one data line on the base substrate do not overlap with an orthographic projection of the plurality of first sub scanning signal lines on the base substrate, and the orthographic projection of the sensing signal line on the base substrate and the orthographic projection of the at least one data line on the base substrate extend through an orthographic projection of the first region on the base substrate; and two adjacent fourth sub scanning signal lines are spaced in a second region, the orthographic projection of the sensing signal line on the base substrate and the orthographic projection of the at least one data line on the base substrate do not overlap with an orthographic projection of the plurality of fourth sub scanning signal lines on the base substrate, and the orthographic projection of the sensing signal line on the base substrate and the orthographic projection of the at least one data line on the base substrate extend through an orthographic projection of the second region on the base substrate, and wherein the first sub scanning signal line and the first gate are spaced in the second direction; and the fourth sub scanning signal line and the third gate are spaced in the second direction. In this way, on the one hand, the length of the gate wiring may be shortened, reducing the probability of short circuit between the gate and the active layer caused by the electrostatic breakdown occurred at the overlapping region between the end of the gate wiring and the active layer. On the other hand, the overlapping region between the gate and the source and drain may be reduced, so as to reduce the probability of data-gate short defects (DGS defects), thereby reducing the probability of point and line defects on the display substrate and improving the quality and yield of display products.

FIG. 1 shows a planar schematic diagram of a display substrate according to an embodiment of the present disclosure.

Referring to FIG. 1, a display substrate according to an embodiment of the present disclosure may include a base substrate 100, pixel units PX provided on the base substrate 100, driving units DRU provided on the base substrate 100, and wirings PL electrically connecting the pixel units PX to the driving units DRU. The driving unit DRU is used to drive the pixel unit PX.

The display substrate may include a display region AA and a non-display region NA. The display region AA may be a region provided with pixel units PX for displaying images. Each pixel unit PX may be described later. The non-display region NA is a region where pixel units PX are not provided, that is, a region not for displaying images. The driving unit DRU used to drive the pixel unit PX and some wirings PL connecting the pixel units PX to the driving units DRU may be provided in the non-display region NA. The non-display region NA corresponds to a border in the resultant display device. A width of the border may be determined based on a width of the non-display region NA.

The display region AA may have various shapes. For example, the display region AA may be provided in various shapes such as closed polygons (such as rectangles) with straight edges, circles and ellipses with curved edges, and semicircles and semi-ellipses with straight and curved edges. In embodiments of the present disclosure, the display region AA is provided as a region in a quadrilateral shape with straight edges. It should be understood that this is only an exemplary embodiment of the present disclosure and not a limitation on the present disclosure.

The non-display region NA may be provided on at least one side of the display region AA. In embodiments of the present disclosure, the non-display region NA may surround a periphery of the display region AA. In embodiments of the present disclosure, the non-display region NA may include a horizontal part extending in a first direction X and a vertical part extending in a second direction Y.

The pixel units PX are provided in the display region AA. The pixel unit PX is the smallest unit used to display images, and a plurality of pixel units may be provided. For example, the pixel unit PX may include a light-emitting device that emits white light and/or colored light.

The plurality of pixel units PX may be provided and arranged in a matrix form along rows extending in the first direction X and columns extending in the first direction Y. However, in embodiments of the present disclosure, the arrangement form of the pixel units PX is not specifically limited, and the pixel units PX may be arranged in various forms. For example, the pixel units PX may be arranged so that a direction tilted relative to the first direction X and the first direction Y becomes a column direction, and a direction intersecting with the column direction becomes a row direction.

One pixel unit PX may include a plurality of sub-pixels. For example, one pixel unit PX may include three sub-pixels, namely a first sub-pixel SP1, a second sub-pixel SP2, and a third sub-pixel SP3. For another example, one pixel unit PX may include 4 sub-pixels, namely a first sub-pixel SP1, a second sub-pixel SP2, a third sub-pixel SP3, and a fourth sub-pixel. For example, the first sub-pixel SP1 may be a red sub-pixel, the second sub-pixel SP2 may be a green sub-pixel, the third sub-pixel SP3 may be a blue sub-pixel, and the fourth sub-pixel may be a white sub-pixel.

Each sub-pixel may include a light-emitting element and a pixel driving circuit for driving the light-emitting element. For example, the first sub-pixel SP1 may include a first light-emitting element located in a first light-emitting region SPA1 and a first pixel driving circuit SPC1 for driving the first light-emitting element. The first light-emitting element may emit red light. The second sub-pixel SP2 may include a second light-emitting element located in a second light-emitting region SPA2 and a second pixel driving circuit SPC2 for driving the second light-emitting element. The second light-emitting element may emit green light. The third sub-pixel SP3 may include a third light-emitting element located in a third light-emitting region SPA3 and a third pixel driving circuit SPC3 for driving the third light-emitting element. The third light-emitting element may emit blue light.

A light-emitting region of the sub-pixel may be a region where the light-emitting element of the sub-pixel is located. For example, in an OLED display panel, the light-emitting element of the sub-pixel may include a stack of a first electrode (such as an anode), a light-emitting material layer, and a second electrode (such as a cathode). In this way, the light-emitting region of the sub-pixel may be a region corresponding to the light-emitting material layer sandwiched by the anode and the cathode.

The sub-pixel further includes a non-light-emitting region. For example, the pixel driving circuit of the sub-pixel is located in the non-light-emitting region of the sub-pixel. A ratio of an area of the light-emitting region of each sub-pixel to the overall area of the sub-pixel (the sum of the area of the light-emitting region and an area of the non-light-emitting region) determines an aperture ratio of the sub-pixel.

The light-emitting device (such as the light-emitting layer, abbreviated as an EL layer) of OLED may not have good consistency during fabrication. For example, when using the evaporation process to fabricate the EL layer, the limitations of the evaporation process may result in inconsistent EL layers of sub-pixels fabricated, leading to uneven light-emitting brightness or chromaticity between different sub-pixels. Moreover, as the usage time increases, the EL layers may experience varying degrees of aging, which may also lead to inconsistent EL layers of sub-pixels, resulting in uneven light-emitting brightness or chromaticity between different sub-pixels. In an embodiment of the present disclosure, the display substrate may also include a photosensitive circuit OSC, which may sense the actual light emitted by the pixel unit. In this way, in an embodiment of the present disclosure, the display substrate may perform optical compensation on the sub-pixels within each pixel unit based on the actual light emitted by the pixel unit sensed by the photosensitive circuit OSC, so as to improve the light emitting uniformity of the display substrate.

For example, in some exemplary embodiments of the present disclosure, each pixel unit PX is provided with a photosensitive circuit OSC. Each photosensitive circuit OSC senses the actual light emitted by the pixel unit PX.

For example, in an embodiment of the present disclosure, at least two pixel units PX may share one photosensitive circuit OSC. Referring to FIG. 1, in the same column of pixel units, two pixel units PX located in adjacent two rows may share one photosensitive circuit OSC. In this way, there is no need to provide one photosensitive circuit for each pixel unit PX, which may reduce the number of photosensitive circuits and improve the aperture ratio. When the display substrate is in a display state, the photosensitive circuit OSC may sense the actual light emitted by the two pixel units adjacent to the photosensitive circuit OSC. For example, the photosensitive circuit OSC may at least include a photoelectric conversion element. In this way, the photosensitive circuit OSC may be used to: sense the actual light emitted by the two pixel units adjacent to the photosensitive circuit OSC; and transmit a sensing electrical signal according to the sensed light.

For another example, referring to FIG. 1, the photosensitive circuit OSC may transmit the sensing electrical signal to an external circuit, such as a control IC of the display device. The control IC may control a control signal transmitted to the pixel unit PX according to the sensing electrical signal, for example, may control a data signal transmitted to the pixel driving circuit of each sub-pixel. Under the control of the data signal, each sub-pixel emits light accordingly.

In the embodiment shown in FIG. 1, the sub-pixels SP1, SP2, and SP3 are provided side by side. Each of the sub-pixels SP1, SP2, and SP3 has a data line DL.

Figure 2A:
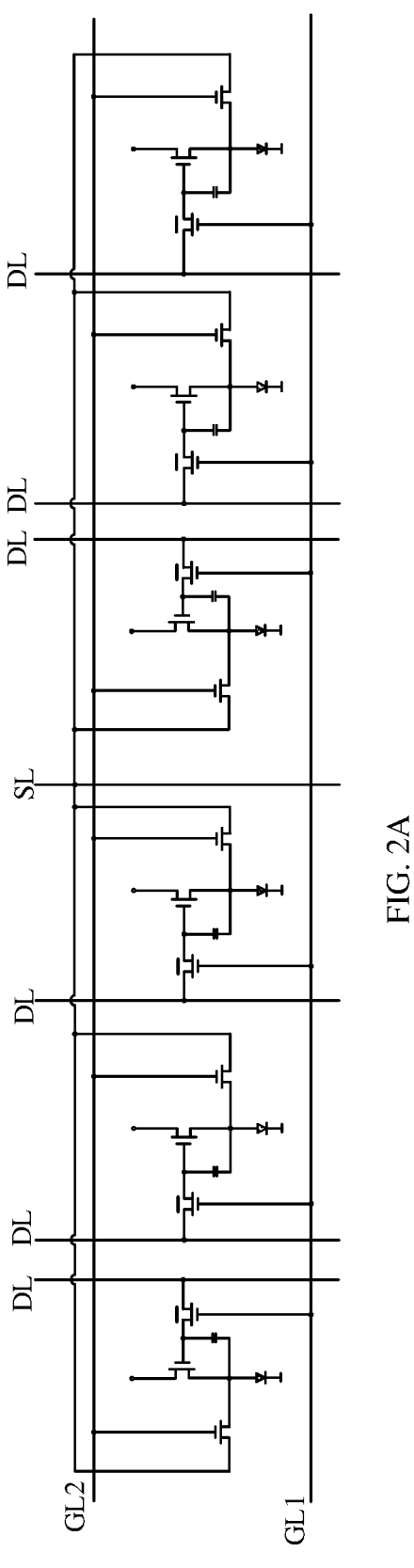
FIG. 2A shows an equivalent circuit diagram of pixel driving circuits for a plurality of sub-pixels of the display substrate shown in FIG. 1.
Figure 2B:
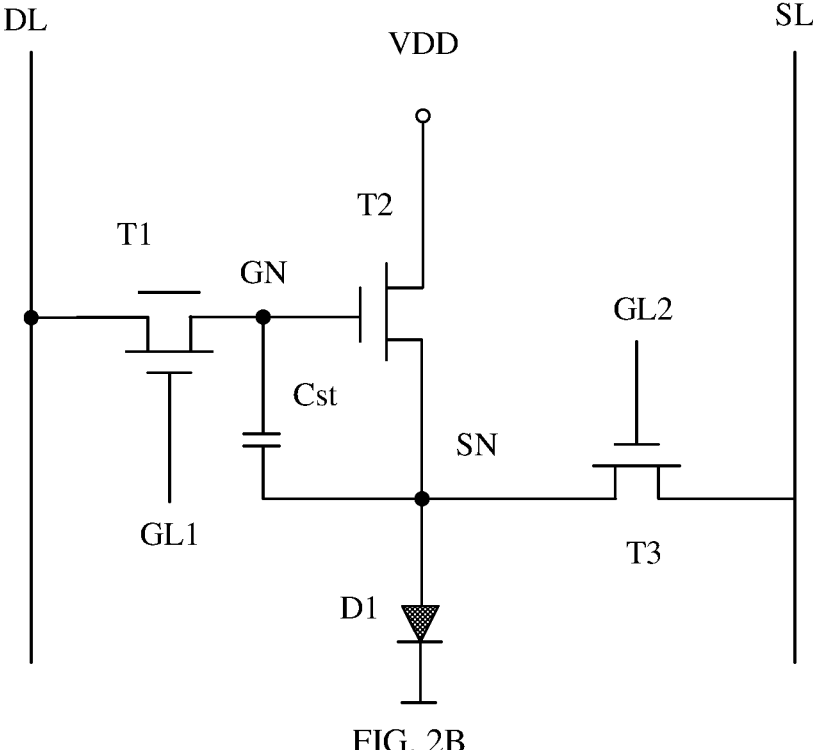
FIG. 2B is an equivalent circuit diagram of a pixel circuit for a single sub-pixel of the display substrate shown in FIG. 1.

FIG. 2A shows an equivalent circuit diagram of pixel driving circuits for the plurality of sub-pixels of the display substrate shown in FIG. 1, and FIG. 2B is an equivalent circuit diagram of a pixel driving circuit for a single sub-pixel of the display substrate shown in FIG. 1. The pixel driving circuit shown in FIG. 2B may be any of the pixel driving circuit SPC1, SPC2, or SPC3 described above. Referring to FIGS. 2A and 2B, the pixel driving circuit may include a plurality of elements such as a switching transistor T1, a driving transistor T2, a sensing transistor T3, and a storage capacitor Cst. The pixel driving circuit may be referred to as a 3T1C structure.

It should be noted that the 3T1C structure is used as an example here to explain the pixel driving circuit included in the display substrate according to embodiments of the present disclosure. However, the pixel driving circuit included in the display substrate of embodiments of the present disclosure is not limited to the 3T1C structure.

Referring to FIG. 2B, a gate of the switching transistor T1 is connected to a first scanning signal line GL1. A first electrode of the switching transistor T1 is connected to a data line DL. A second electrode of the switching transistor T1 is connected to a gate of the driving transistor T2. For example, both the second electrode of the switching transistor T1 and the gate of the driving transistor T2 may be electrically connected to a node GN. The switching transistor T1 is used to control the voltage signal from the data line DL to be written into the pixel driving circuit.

It should be noted that each transistor may include an active layer, a gate, a first electrode (such as a source), and a second electrode (such as a drain). For example, the switching transistor T1 includes a first gate G1 and a first active layer ACT1. The driving transistor T2 includes a second gate G2 and a second active layer ACT2. The sensing transistor T3 includes a third gate G3 and a third active layer ACT3. In embodiments of the present disclosure, the active layers of the transistors may be located in the semiconductor layer, and the gates may be located in different conductive layers.

It should be noted that in the present disclosure, the first electrode of the transistor may refer to one of the source and the drain of the transistor, and the second electrode of the transistor may refer to the other of the source and the drain of the transistor.

The gate of the driving transistor T2 is electrically connected to the node GN. The first electrode of the driving transistor T2 is connected to a first power signal (such as a high voltage level signal VDD). The second electrode of the driving transistor T2 may be connected to an anode of the light-emitting element D1, so as to generate a driving current according to the voltage signal to drive the light-emitting element D1 to emit light. For example, the light-emitting element D1 may be an organic light-emitting diode (OLED).

Two terminals of the storage capacitor Cst are respectively connected to the gate and the source of the driving transistor T2 to store the voltage signal input from the data line. For example, one terminal of the storage capacitor Cst is electrically connected to the node GN, and the other terminal of the storage capacitor Cst is electrically connected to the node SN. That is, one terminal of the storage capacitor Cst, the second electrode of the switching transistor T1, and the gate of the driving transistor T2 are connected to the node GN, while the other terminal of the storage capacitor Cst, the second electrode of the driving transistor T2, and the anode of the light-emitting element D1 are electrically connected to the node SN.

A gate of the sensing transistor T3 is connected to a second scanning signal line GL2. A first electrode of the sensing transistor T3 is connected to a sensing signal line SL. A second electrode of the sensing transistor T3 is electrically connected to the node SN.

The anode of the light-emitting element D1 is electrically connected to the node SN. The cathode of the light-emitting element D1 is electrically connected to a low voltage level signal VSS. Both the level signals VDD and VSS are DC voltage signals used to provide desired voltages for driving the light-emitting element D1 to emit light.

Figure 3:
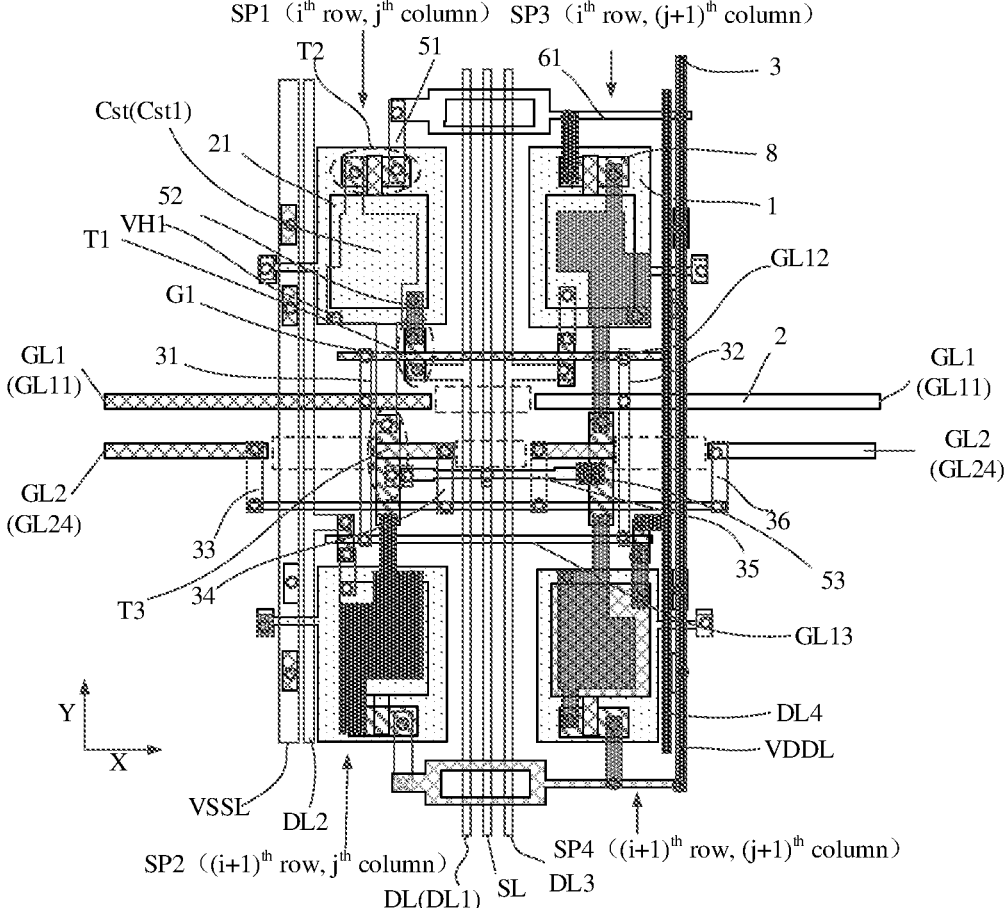
FIG. 3 shows a local plan view of a display substrate according to some embodiments of the present disclosure, which schematically shows a plan view of a pixel driving circuit for a plurality of sub-pixels included in the display substrate.

FIG. 3 shows a local plan view of a display substrate according to some embodiments of the present disclosure, which schematically shows a plan view of pixel driving circuits of a plurality of sub-pixels included in a display substrate. FIGS. 4 to 8 show plan views of one or more film layers shown in FIG. 3, respectively.

Figure 4:
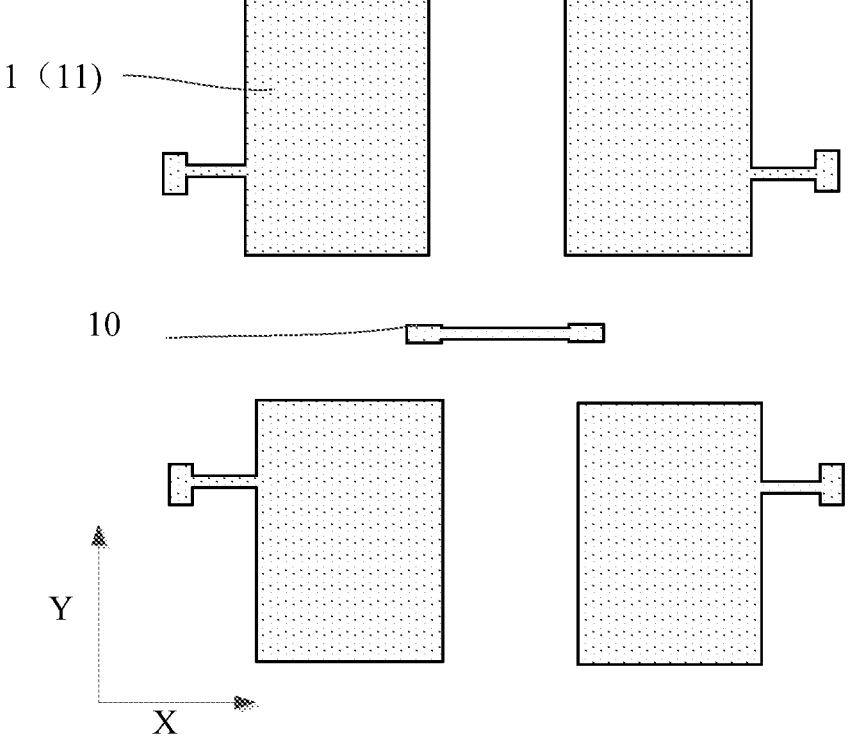
Figure 5:
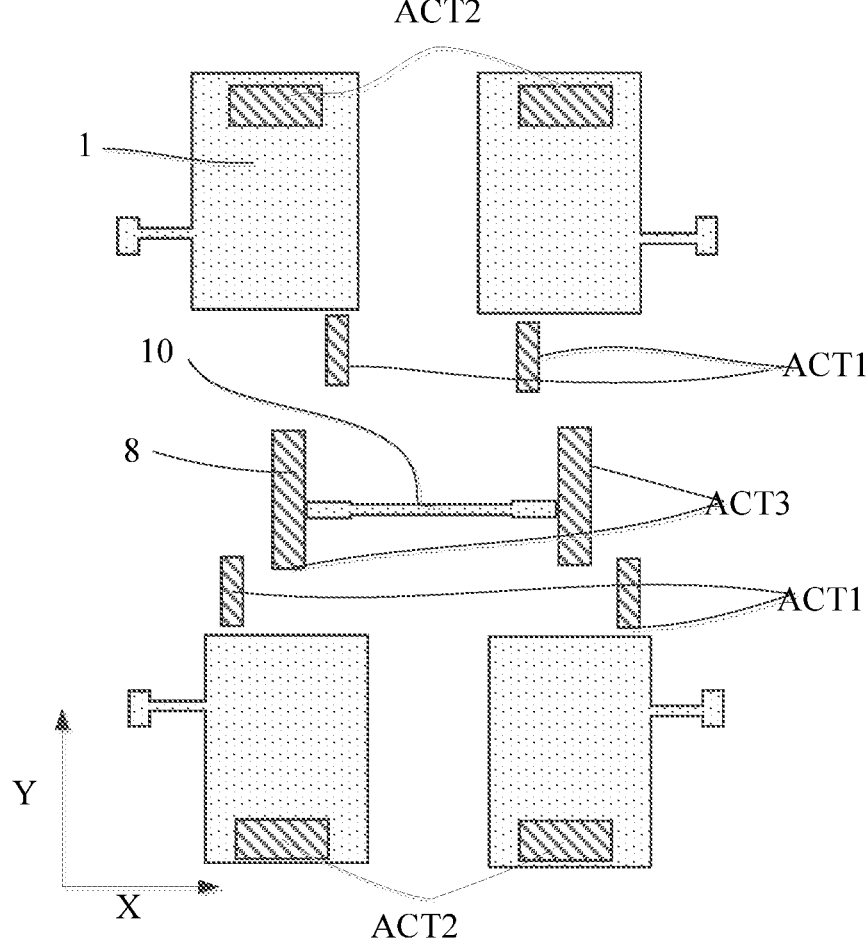
Figure 6:
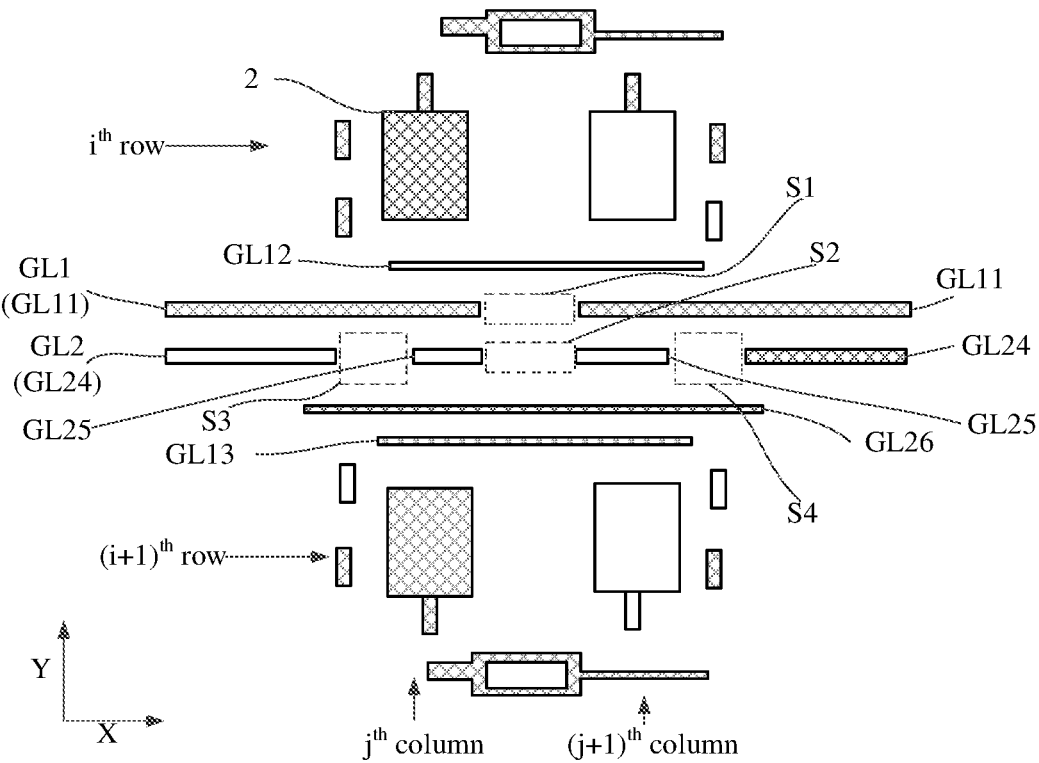
Figure 7:
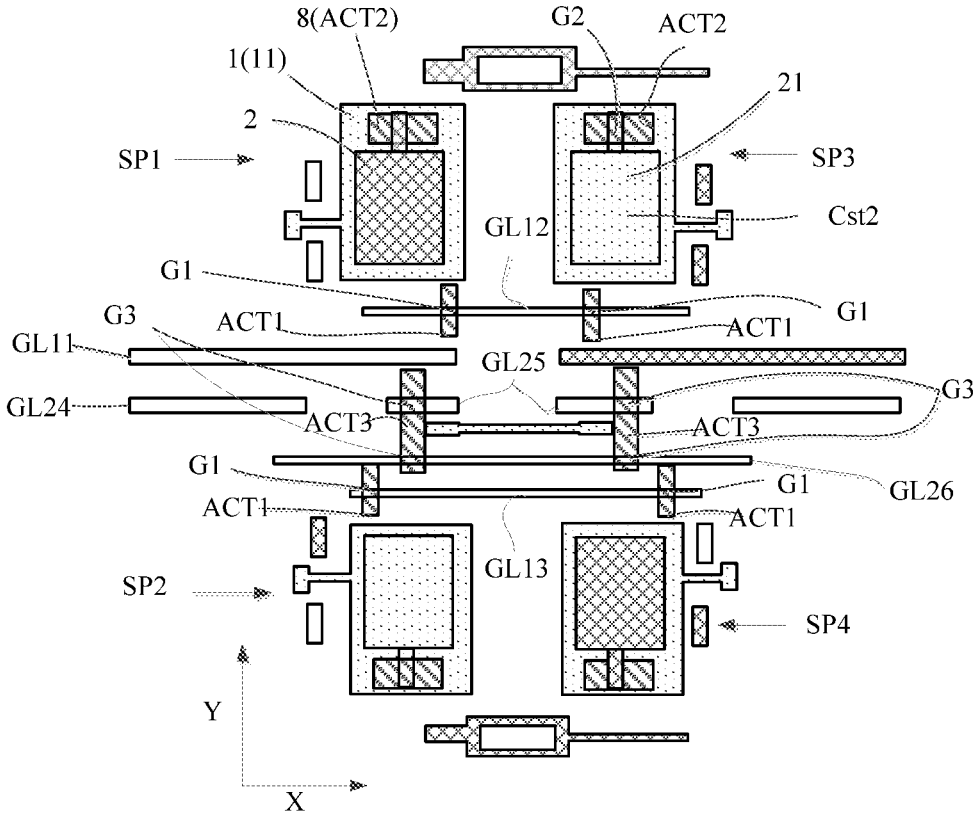
Figure 8:
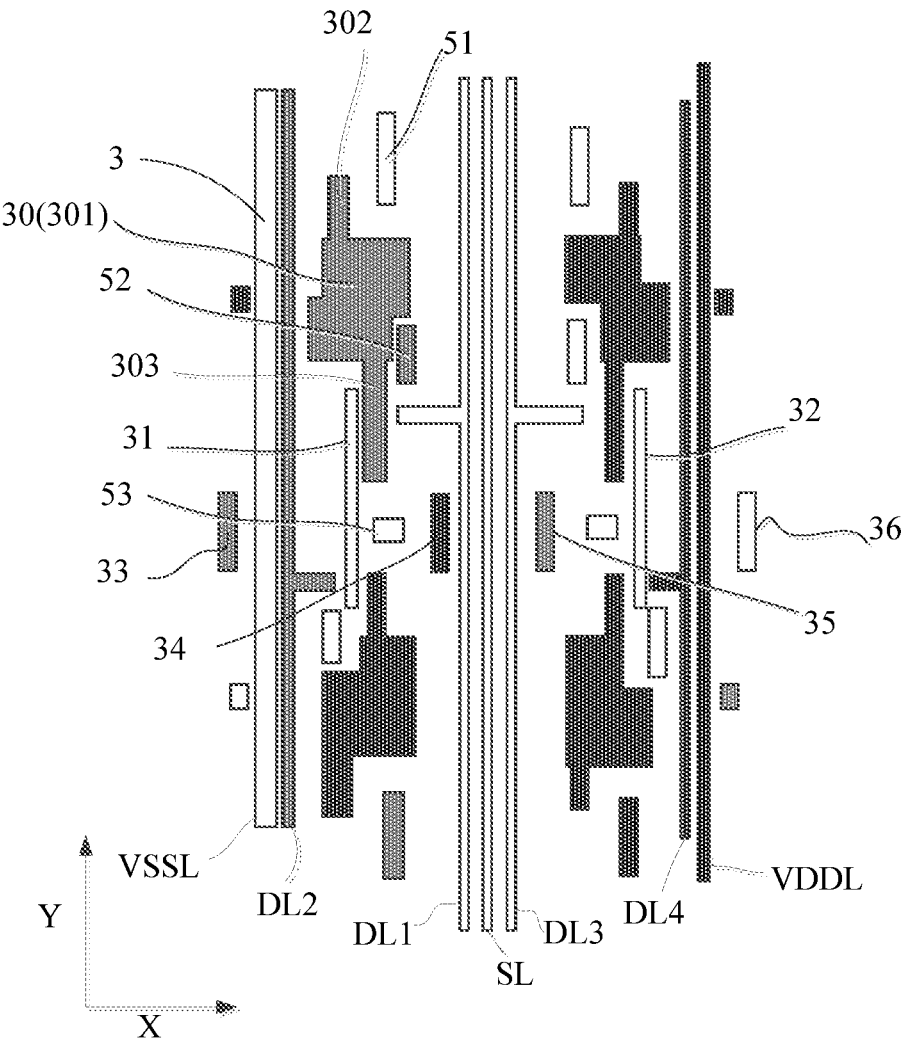

Referring to FIGS. 3 to 8, the display substrate may include a plurality of conductive layers, a semiconductor layer, and a plurality of insulation layers. For the convenience of description, the plurality of conductive layers are described as a first conductive layer, a second conductive layer, and a third conductive layer, respectively. For example, FIG. 4 shows a part of the first conductive layer 1. FIG. 5 shows a part of the first conductive layer 1, a part of the semiconductor layer 8, as well as a spatial position relationship between an orthogonal projection of the part of the first conductive layer 1 and an orthogonal projection of the part of the semiconductor layer 8 in a direction perpendicular to the base substrate. It should be noted that the part of the semiconductor layer 8 may have semiconductor characteristics to form the channel region of each transistor, while other parts of the semiconductor layer 8 may be conductive to have conductive characteristics to form the source region, drain region, and other conductive portions of each transistor. FIG. 6 shows a part of the second conductive layer 2 in which the gates of some transistors, the first scanning signal line GL1, and the like may be located. For example, the second conductive layer 2 may be a conductive layer composed of a gate material. On the basis of FIGS. 5 and 6, FIG. 7 further shows a spatial position relationship between an orthogonal projection of the second conductive layer 2 and orthogonal projections of the first conductive layer 1 and the semiconductor layer 8 in the direction perpendicular to the base substrate. FIG. 8 shows a part of the third conductive layer 3, and the third conductive layer 3 may be a film layer in which a plurality of data lines DL1, DL2, DL3 and DL4, the first power signal line VDDL, the second power signal line VSSL, the sensing signal line SL, etc. are located. That is, the third conductive layer 3 may be a conductive layer composed of a source or drain material. FIG. 3 further shows a plurality of via holes exposing a part of the first conductive layer 1, a part of the semiconductor layer 8, and a part of the second conductive layer 9. The plurality of via holes may be used to form an electrical connection between a part of the first conductive layer 1 and a part of the third conductive layer 3, and/or to form an electrical connection between a part of the semiconductor layer 8 and a part of the third conductive layer 3, and/or, to form an electrical connection between the second conductive layer 2 and a part of the third conductive layer 3.

For example, the first conductive layer 1, the semiconductor layer 8, the second conductive layer 2, and the third conductive layer 3 may be sequentially provided on the base substrate of the display substrate. Specifically, the first conductive layer 1 may be provided on the base substrate, the semiconductor layer 8 may be provided on a side of the first conductive layer 1 away from the base substrate, the second conductive layer 2 may be provided on a side of the semiconductor layer 8 away from the base substrate, and the third conductive layer 3 may be provided on a side of the second conductive layer 2 away from the base substrate. The stacking relationship between the film layers may be described in more detail in the following.

It should be understood that the display substrate may further include a plurality of insulation layers between any adjacent two of the base substrate, the first conductive layer 1, the semiconductor layer 8, the second conductive layer 2, and the third conductive layer 3. These insulation layers may be described in conjunction with the cross-sectional diagrams in the following. A via hole or groove, that exposes at least a part of one of the first conductive layer 1, the semiconductor layer 8, the second conductive layer 2, and the third conductive layer 3, may be formed in the insulation layer, so as to achieve electrical connection between components located in different film layers.

For example, the display substrate may include a plurality of signal lines. Referring to FIGS. 2B and 3, the plurality of signal lines may include a first scanning signal line GL1, a second scanning signal line GL2, a data line DL, a first power signal line VDDL, and a sensing signal line SL. The first power signal line VDDL, the sensing signal line SL, and the data line DL may be located in the third conductive layer 3, and the first scanning signal line GL1 and the second scanning signal line GL2 may be located in the second conductive layer 2.

In some exemplary embodiments of the present disclosure, referring to FIGS. 3 and 6, a part of the first scanning signal line GL1 may extend substantially in the first direction X. The first scanning signal line GL1 is used to supply a first scanning signal to a plurality of pixel units arranged in the first direction X. For example, the first scanning signal line GL1 may supply the first scanning signal to the first sub-pixel SP1 and the third sub-pixel SP3. At least one data line DL is provided on the base substrate, and the at least one data line DL is used to supply a data signal to a plurality of pixel units arranged in the second direction Y, and the at least one data line DL extends in the second direction Y. A sensing signal line SL is provided on the base substrate, the sensing signal line SL is used to supply a sensing signal to the plurality of pixel units arranged in the second direction, and the sensing signal line SL extends in the second direction Y. The first scanning signal line GL1 includes a plurality of first sub scanning signal lines GL11, and the plurality of first sub scanning signal lines GL11 extend in the first direction X. Two adjacent first sub scanning signal lines GL11 are spaced in a first region S1, an orthographic projection of the sensing signal line SL on the base substrate and an orthographic projection of the at least one data line, such as the first data line DL1, on the base substrate do not overlap with an orthographic projection of the plurality of first sub scanning signal lines GL11 on the base substrate, and the orthographic projection of the sensing signal line SL on the base substrate and the orthographic projection of the at least one data line, such as the first data line DL1, on the base substrate extend through an orthographic projection of the first region S1 on the base substrate.

In exemplary embodiments, the plurality of first sub scanning signal lines GL11 are aligned in the second direction Y.

In above embodiments, the first scanning signal line GL1 is adopted a multi-segment design and is spaced in the middle of the first region S1, which may reduce an overlapping region between the first scanning signal line GL1 and the sensing signal line SL as well as at least one data line DL, such as the first data line DL1, and reduce the probability of short circuit defects between the first scanning signal line GL1 and the sensing signal line SL as well as at least one data line DL, thereby reducing the probability of defects on the display substrate and improving the quality and yield of display products.

In some exemplary embodiments of the present disclosure, referring to FIGS. 3 and 6, the display substrate further includes: a second scanning signal line GL2 on the base substrate, the second scanning signal line GL2 is used to supply a second scanning signal to a plurality of pixel units arranged in the first direction. For example, the second scanning signal line GL2 applies the second scanning signal to the second sub-pixel SP2 and the fourth sub-pixel SP4. The second scanning signal line GL2 includes a plurality of fourth sub scanning signal lines GL24, and the plurality of fourth sub scanning signal lines GL24 extend in the first direction X. Two adjacent fourth sub scanning signal lines GL24 are spaced in a second region S2, the orthographic projection of the sensing signal line SL on the base substrate and the orthographic projection of the at least one data line, such as the first data line DL1, on the base substrate do not overlap with an orthographic projection of the plurality of fourth sub scanning signal lines GL24 on the base substrate, and the orthographic projection of the sensing signal line SL on the base substrate and the orthographic projection of the at least one data line, such as the first data line DL1, on the base substrate extend through an orthographic projection of the second region S2 on the base substrate. The second scanning signal line GL2 is adopted a multi-segment design and is spaced in the middle of the second region S2, which may reduce an overlapping region between the second scanning signal line GL2 and the sensing signal line SL as well as at least one data line DL, and reduce the probability of short circuit defects between the second scanning signal line GL2 and the sensing signal line SL as well as at least one data line DL, thereby reducing the probability of defects on the display substrate and improving the quality and yield of display products.

In exemplary embodiments, the plurality of fourth sub scanning signal lines GL24 are aligned in the second direction Y.

In some exemplary embodiments of the present disclosure, referring to FIGS. 3 and 6, the first scanning signal line GL1 also includes a second sub scanning signal line GL12, the second sub scanning signal line GL12 extends in the first direction X, and the second sub scanning signal line GL12 and the first sub scanning signal line GL11 are spaced in the second direction Y. The display substrate also includes a first scanning signal conversion portion 31 on the base substrate, and the first scanning signal conversion portion 31 extends in the second direction Y. The first sub scanning signal line GL11 is electrically connected to the second sub scanning signal line GL12 through the first scanning signal conversion portion 31. By electrically connecting the first scanning signal conversion portion 31, series connection of a plurality of segmented sub scanning signal lines of the first scanning signal line may be achieved, which may effectively complete the transmission of scanning signals and shorten the design length of the first sub scanning signal line GL11 and/or the second sub scanning signal line GL12 in the first direction X, thereby reducing the probability of short circuit between a gate and an active layer when the gate is formed in an overlapping region between the first scanning signal line GL1 and a part of the active layer 8, and improving the quality and yield of display products.

In some exemplary embodiments, the orthographic projection of the sensing signal line SL on the base substrate and the orthographic projection of at least one data line DL1 and DL3 on the base substrate overlap with the orthographic projection of at least one second sub scanning signal line GL12 on the base substrate. For example, the orthographic projection of at least one second sub scanning signal line GL12 on the base substrate extends through the orthographic projection of the sensing signal line SL on the base substrate and the orthographic projection of at least one data line DL1 and DL3 on the base substrate.

In some exemplary embodiments of the present disclosure, referring to FIGS. 3 and 6, the first scanning signal line GL1 also includes a third sub scanning signal line GL13, the third sub scanning signal line GL13 extends in the first direction X, and the third sub scanning signal line GL13 and the first sub scanning signal line GL11 are spaced in the second direction Y. The first sub scanning signal line GL11 is electrically connected to the third sub scanning signal line GL13 through the first scanning signal conversion portion 31. By electrically connecting the first scanning signal conversion portion 31, series connection of a plurality of segmented sub scanning signal lines of the first scanning signal line may be achieved, which may effectively complete the transmission of scanning signals and shorten the design length of the first sub scanning signal line GL11 and/or the third sub scanning signal line GL13 in the first direction X, thereby reducing the probability of short circuit between a gate and an active layer when the gate is formed in an overlapping region between the first scanning signal line GL1 and a part of the active layer 8, and improving the quality and yield of display products.

In some exemplary embodiments, the orthographic projection of the sensing signal line SL on the base substrate and the orthographic projection of at least one data line DL1 and DL3 on the base substrate overlap with the orthographic projection of at least one third sub scanning signal line GL13 on the base substrate. For example, the orthographic projection of at least one third sub scanning signal line GL13 on the base substrate extends through the orthographic projection of the sensing signal line SL on the base substrate and the orthographic projection of at least one data line DL1 and DL3 on the base substrate.

In some exemplary embodiments of the present disclosure, referring to FIGS. 3 and 6, the second scanning signal line GL2 also includes a plurality of fifth sub scanning signal lines GL25, and the plurality of fifth sub scanning signal lines GL25 extend in the first direction X. The display substrate also includes: a second power signal line VSSL on the base substrate, the second power signal line VSSL is used to supply a second power signal to the plurality of pixel units arranged in the second direction Y. For example, the second power signal line VSSL is used to supply the second power signal to the first sub-pixel SP1 and the second sub-pixel SP2 arranged in the second direction Y, and the second power signal line VSSL extends in the second direction Y. Adjacent fourth sub scanning signal line GL24 and fifth sub scanning signal line GL25 are spaced in a third region S3, an orthographic projection of the second power signal line VSSL on the base substrate does not overlap with an orthographic projection of the plurality of fourth sub scanning signal lines GL24 on the base substrate, the orthographic projection of the second power signal line VSSL on the base substrate does not overlap with an orthographic projection of the plurality of fifth sub scanning signal lines GL25 on the base substrate, and the orthographic projection of the second power signal line VSSL on the base substrate extends through an orthographic projection of the third region S3 on the base substrate. The second scanning signal line GL2 is adopted a multi-segment design and is spaced in the middle of the third region S3, which may reduce an overlapping region between the second scanning signal line GL2 and the second power signal line VSSL as well as at least one data line DL, such as the first data line DL2, and reduce the probability of short circuit defects between the second scanning signal line GL2 and the second power signal line VSSL as well as at least one data line DL, thereby reducing the probability of defects on the display substrate and improving the quality and yield of display products.

In the exemplary embodiment, the plurality of fifth sub scanning signal lines GL25 are aligned in the second direction Y.

In some exemplary embodiments of the present disclosure, referring to FIGS. 3 and 6, the display substrate also includes: a first power signal line VDDL on the base substrate, the first power signal line VDDL is used to supply a first power signal to the plurality of pixel units arranged in the second direction Y, and the first power signal line VDDL extends in the second direction Y. Adjacent fourth sub scanning signal line GL24 and fifth sub scanning signal line GL25 are spaced in a fourth region S4, an orthographic projection of the first power signal line VDDL on the base substrate does not overlap with the orthographic projection of the plurality of fourth sub scanning signal lines GL24 on the base substrate, the orthographic projection of the first power signal line VDDL on the base substrate does not overlap with the orthographic projection of the plurality of fifth sub scanning signal lines GL25 on the base substrate, and the orthographic projection of the first power signal line VDDL on the base substrate extends through an orthographic projection of the fourth region S4 on the base substrate. The second scanning signal line GL2 is adopted a multi-segment design and is spaced in the middle of the fourth region S4, which may reduce an overlapping region between the second scanning signal line GL2 and the second power signal line VSSL as well as at least one data line DL, such as the fourth data line DL4, and reduce the probability of short circuit defects between the second scanning signal line GL2 and the first power signal line VDDL as well as at least one data line DL, thereby reducing the probability of defects on the display substrate and improving the quality and yield of display products.

In some exemplary embodiments of the present disclosure, referring to FIGS. 3 and 6, the plurality of fifth sub scanning signal lines GL25 may be provided between two adjacent fourth sub scanning signal lines GL24, the plurality of fifth sub scanning signal lines GL25 between two adjacent fourth sub scanning signal lines GL24 are spaced in the second region S2, and the orthographic projection of the sensing signal line SL on the base substrate and the orthographic projection of the at least one data line DL, such as the first data line DL1, on the base substrate do not overlap with the orthographic projection of the plurality of fifth sub scanning signal lines GL25 on the base substrate. The fifth sub scanning signal line GL25 is adopted a multi-segment design and is spaced in the middle of the second region S2, which may reduce an overlapping region between the fifth sub scanning signal line GL25 and the sensing signal line SL as well as at least one data line DL, and reduce the probability of short circuit defects between the second scanning signal line GL2 and the sensing signal line SL as well as at least one data line DL, thereby reducing the probability of defects on the display substrate and improving the quality and yield of display products.

In some exemplary embodiments of the present disclosure, referring to FIGS. 3 and 6, the second scanning signal line GL2 also includes a sixth sub scanning signal line GL26, the sixth sub scanning signal line GL26 extends in the first direction X, and the sixth sub scanning signal line GL26 and the fourth sub scanning signal line GL24 are spaced in the second direction Y. The display substrate also includes a third scanning signal conversion portion 33 on the base substrate, and the third scanning signal conversion portion 33 extends in the second direction Y. The fourth sub scanning signal line GL24 is electrically connected to the sixth sub scanning signal line GL26 through the third scanning signal conversion portion 33. By electrically connecting the third scanning signal conversion portion 33, series connection of a plurality of segmented sub scanning signal lines of the second scanning signal line may be achieved, which may effectively complete the transmission of scanning signals and shorten the design length of the fourth sub scanning signal line GL24 and/or the sixth sub scanning signal line GL26 in the first direction X, thereby reducing the probability of short circuit between and a gate and an active layer when a gate is formed in an overlapping region between the second scanning signal line GL2 and a part of the active layer 8, and improving the quality and yield of display products.

In some exemplary embodiments, the orthographic projection of the sensing signal line SL on the base substrate and the orthographic projection of at least one data line DL1 and DL3 on the base substrate overlap with the orthographic projection of at least one sixth sub scanning signal line GL26 on the base substrate. For example, the orthographic projection of at least one sixth sub scanning signal line GL26 on the base substrate extends through the orthographic projection of the sensing signal line SL on the base substrate and the orthographic projection of at least one data line DL1 and DL3 on the base substrate.

In some exemplary embodiments of the present disclosure, referring to FIGS. 3 and 6, the display substrate also includes a fourth scanning signal conversion portion 34 on the base substrate, and the fourth scanning signal conversion portion 34 extends in the second direction Y. The sixth sub scanning signal line GL26 is electrically connected to the fifth sub scanning signal line GL25 through the fourth scanning signal conversion portion 34. By electrically connecting the fourth scanning signal conversion portion 34, series connection of a plurality of segmented sub scanning signal lines of the second scanning signal line may be achieved, which may effectively complete the transmission of scanning signals and shorten the design length of the fifth sub scanning signal line GL25 and/or the sixth sub scanning signal line GL26 in the first direction X, thereby reducing the probability of short circuit between a gate and an active layer when the gate is formed in an overlapping region between the second scanning signal line GL2 and a part of the active layer 8, and improving the quality and yield of display products.

In some exemplary embodiments of the present disclosure, referring to FIGS. 3 and 6, at least one of the plurality of pixel units includes a first sub-pixel SP1, a second sub-pixel SP2, a third sub-pixel SP3, and a fourth sub-pixel SP4. The first sub-pixel SP1 is in a $i^{th}$ row and a $j^{th}$ column, the second sub-pixel SP2 is in a $(i+1)^{th}$ row and the $j^{th}$ column, the third sub-pixel SP3 is in the $i^{th}$ row and a $(j+1)^{th}$ column, the fourth sub-pixel SP4 is in a $(i+1)^{th}$ row and the $(j+1)^{th}$ column, both i and j are positive integers greater than or equal to 1. In the second direction Y, the first sub scanning signal line GL11, the second sub scanning signal line GL12, the third sub scanning signal line GL13, the fourth scanning signal line GL24, the fifth scanning signal line GL25, and the sixth scanning signal line GL26 used to supply scanning signals to sub-pixels in the $i^{th}$ row and sub-pixels in the $(i+1)^{th}$ row are between the sub-pixels in the $i^{th}$ row and the sub-pixels in the $(i+1)^{th}$ row. The plurality of sub-pixels may emit one of red, green, blue, or white light. Embodiments of the present disclosure do not specially limit on the light-emitting color of each sub-pixel.

In some exemplary embodiments of the present disclosure, referring to FIGS. 3 and 7, each sub-pixel may include a light-emitting element and a pixel driving circuit for driving the light-emitting element. The pixel driving circuit at least includes a switching transistor T1, which includes a first active layer ACT1. An orthographic projection of the second sub scanning signal line GL12 on the base substrate partially overlaps with an orthographic projection of a first active layer ACT1 of the first sub-pixel SP1 on the base substrate and an orthographic projection of a first active layer ACT1 of the third sub-pixel SP3 on the base substrate, and a part of the second sub scanning signal line GL12 overlapping with the first active layer of the first sub-pixel SP1 and a part of the second sub scanning signal line GL12 overlapping with the first active layer of the third sub-pixel SP3 form a first gate G1 of a switching transistor T1 of the first sub-pixel and a first gate G1 of a switching transistor T1 of the third sub-pixel, respectively.

In some exemplary embodiments of the present disclosure, referring to FIGS. 3 and 7, an orthographic projection of the third sub scanning signal line GL13 on the base substrate partially overlaps with an orthographic projection of a first active layer ACT1 of the second sub-pixel SP2 on the base substrate and an orthographic projection of a first active layer ACT1 of the fourth sub-pixel SP4 on the base substrate, and a part of the third sub scanning signal line GL13 overlapping with the first active layer ACT1 of the second sub-pixel SP2 and a part of the third sub scanning signal line GL13 overlapping with the first active layer ACT1 of the fourth sub-pixel SP4 form a first gate G1 of a switching transistor T1 of the second sub-pixel and a first gate G1 of a switching transistor T1 of the fourth sub-pixel, respectively.

In some exemplary embodiments of the present disclosure, referring to FIGS. 3 and 6, one of two adjacent first sub scanning signal lines GL11 is electrically connected to a first end of the second sub scanning signal line GL12 and a first end of the third sub scanning signal line GL13 through the first scanning signal conversion portion 31. And/or, the display substrate also includes a second scanning signal conversion portion 32 on the base substrate, the second scanning signal conversion portion 32 extends in the second direction Y, and the other of the two adjacent first sub scanning signal lines GL11 is electrically connected to a second end of the second sub scanning signal line GL12 and a second end of the third sub scanning signal line GL13 through the second scanning signal conversion portion 32. By electrically connecting the first scanning signal conversion portion 31 and the second scanning signal conversion portion 32, series connection of a plurality of segmented sub scanning signal lines of the first scanning signal line may be achieved, which may effectively complete the transmission of scanning signals and shorten the design length of the first sub scanning signal line GL11, and/or the second sub scanning signal line GL12, and/or the third sub scanning signal line GL13 in the first direction X, thereby reducing the probability of short circuit between a gate and an active layer when the gate is formed in an overlapping region between the first scanning signal line GL1 and a part of the active layer 8, and/or reducing the overlapping region between the first scanning signal line GL1 and at least one data line or the sensing signal line, reducing the probability of the short circuit between the gate and the source/drain, and improving the quality and yield of display products.

In some exemplary embodiments of the present disclosure, referring to FIGS. 3 and 7, the pixel driving circuit may also include a sensing transistor T3, which includes a third active layer ACT3. An orthographic projection of one of two adjacent fifth sub scanning signal lines GL25 on the base substrate partially overlaps with an orthographic projection of a third active layer ACT3 of the first sub-pixel SP1 on the base substrate, an orthographic projection of the other of the two adjacent fifth sub scanning signal lines GL25 on the base substrate partially overlaps with an orthographic projection of a third active layer ACT3 of the third sub-pixel on the base substrate, and a part of the fifth sub scanning signal line GL25 overlapping with the third active layer ACT3 of the first sub-pixel and a part of the fifth sub scanning signal line GL25 overlapping with the third active layer ACT3 of the third sub-pixel form a third gate G3 of a sensing transistor T3 of the first sub-pixel and a third gate G3 of a sensing transistor T3 of the third sub-pixel, respectively.

In some exemplary embodiments of the present disclosure, referring to FIG. 7, an orthographic projection of a sixth sub scanning signal line GL26 on the base substrate partially overlaps with an orthographic projection of a third active layer ACT3 of the second sub-pixel SP2 on the base substrate and an orthographic projection of a third active layer ACT3 of the fourth sub-pixel SP4 on the base substrate, and a part of the sixth sub scanning signal line GL26 overlapping with the third active layer ACT3 of the second sub-pixel SP2 and a part of the sixth sub scanning signal line GL26 overlapping with the third active layer ACT3 of the fourth sub-pixel SP4 form a third gate G3 of a sensing transistor T3 of the second sub-pixel and a third gate G3 of a sensing transistor T3 of the fourth sub-pixel, respectively. The third active layers ACT3 of the second sub-pixel SP2 and the fourth sub-pixel SP4, as well as the third active layers ACT3 of the first and third sub-pixels, may be the same active layer.

In some exemplary embodiments of the present disclosure, referring to FIGS. 3, 6, and 8, the display substrate also includes a fifth scanning signal conversion portion 35 and a sixth scanning signal conversion portion 36 on the base substrate. The fifth scanning signal conversion portion 35 and the sixth scanning signal conversion portion 36 extend in the second direction Y. A first end of the third scanning signal conversion portion 33 is electrically connected to the fourth sub scanning signal line GL24, and a second end of the third scanning signal conversion portion 33 is electrically connected to a first end of the sixth sub scanning signal line GL26. A first end of the fourth scanning signal conversion portion 34 is electrically connected to a first middle part of the sixth sub scanning signal line GL26, and a second end of the fourth scanning signal conversion portion 34 is electrically connected to a first end of the fifth sub scanning signal line GL25. A first end of the fifth scanning signal conversion portion 35 is electrically connected to a second middle part of the sixth sub scanning signal line GL26, and a second end of the fifth scanning signal conversion portion 35 is electrically connected to a first end of another fifth sub scanning signal line GL25. A first end of the sixth scanning signal conversion portion 36 is electrically connected to another fourth sub scanning signal line GL24, and a second end of the sixth scanning signal conversion portion 36 is electrically connected to a second end of the sixth sub scanning signal line GL26.

By designing the plurality of scanning signal conversion portions, the series connections of the plurality of sub scanning signal lines of the scanning signal lines may be achieved, such as the series connection of the fourth sub scanning signal line GL24, the fifth sub scanning signal line GL25, and the sixth sub scanning signal line GL26 of the second scanning signal line GL2, which may not only achieve the normal signal transmission of the scanning signals, but also reduce the design length of at least one sub scanning signal line in the first direction X, thereby reducing the probability of electrostatic breakdown in the overlapping region between the sub scanning signal line and the active layer and improving the yield of display products, while such segmented design of scanning signal lines also reduces the overlapping region between the gate and the source/drain of at least one transistor, thereby reducing the probability of short circuits between the gate and the source/drain and improving the quality and yield of display products.

In some exemplary embodiments of the present disclosure, referring to FIGS. 3 and 6, in the second direction Y, the second sub scanning signal line GL12 is between the sub-pixels in the $i^{th}$ row and the first sub scanning signal line GL11; and/or, in the second direction Y, the third sub scanning signal line GL13 is between the first sub scanning signal line GL11 and the sub-pixels in the $(i+1)^{th}$ row; and/or, in the second direction Y, the fourth sub scanning signal line GL24 is between the first sub scanning signal line GL11 and the sub-pixels in the $(i+1)^{th}$ row; and/or, in the second direction Y, the fourth sub scanning signal line GL24 is aligned with the fifth sub scanning signal line GL25; and/or in the second direction Y, the sixth sub scanning signal line GL26 is between the fourth sub scanning signal line GL24 and the third sub scanning signal line GL13.

In some exemplary embodiments of the present disclosure, referring to FIGS. 3 and 8, in the first direction X, the first scanning signal conversion portion 31 is between the third scanning signal conversion portion 33 and the fourth scanning signal conversion portion 34; and/or, in the first direction X, the fourth scanning signal conversion portion 34 is between the first scanning signal conversion portion 31 and the data line DL; and/or, in the first direction X, the fifth scanning signal conversion portion 35 is between another data line and the second scanning signal conversion portion 32; and/or, in the first direction X, the sixth scanning signal conversion portion 36 is on a side of the first power signal line VDDL away from the second scanning signal conversion portion 32.

In some exemplary embodiments of the present disclosure, referring to FIGS. 3, 7, and 8, the display substrate may include: a semiconductor layer 8 on the base substrate, where the first active layer ACT1 and the third active layer ACT3 are in the semiconductor layer 8; a second conductive layer 2 on a side of the semiconductor layer 8 away from the base substrate; and a third conductive layer 3 on a side of the second conductive layer 2 away from the base substrate. The first sub scanning signal line GL11, the second sub scanning signal line GL12, the third sub scanning signal line GL13, the fourth scanning signal line GL24, the fifth scanning signal line GL25, and the sixth scanning signal line GL26 are in the second conductive layer 2, and the first scanning signal conversion portion 31, the second scanning signal conversion portion 32, the third scanning signal conversion portion 33, the fourth scanning signal conversion portion 34, the fifth scanning signal conversion portion 35, and the sixth scanning signal conversion portion 36 are in the third conductive layer 3.

In some exemplary embodiments of the present disclosure, referring to FIGS. 3 and 7, the display substrate may also include a first conductive portion 21 in the second conductive layer 2. The pixel driving circuit also includes a driving transistor T2. The driving transistor T2 includes a second active layer ACT2, an orthographic projection of the first conductive portion 21 on the base substrate partially overlaps with an orthographic projection of the second active layer ACT2 on the base substrate. A part of the first conductive portion 21 overlapping with the second active layer ACT2 forms a second gate G2 of the driving transistor. The display substrate also includes a first conductive conversion portion 51 in the third conductive layer 3 and a first power signal conversion portion 61 in the second conductive layer 2. A first end of the first power signal conversion portion 61 is electrically connected to the first power signal line VDDL, and a second end of the first power signal conversion portion 61 is electrically connected to a first end of the first conductive conversion portion 51, and a second end of the first conductive conversion portion 51 is electrically connected to a first end of the second active layer ACT2. One of the first and second electrodes of the driving transistor T2 may be electrically connected to the first power signal line VDDL through the first conductive conversion portion 51 and the first power signal conversion portion 61.

In some exemplary embodiments of the present disclosure, referring FIGS. 3, 7, and 8, the display substrate may also include a second conductive conversion portion 52 in the third conductive layer 3. A first end of the second conductive conversion portion 52 is electrically connected to the first conductive portion 21, a second end of the second conductive conversion portion 52 is electrically connected to a first end of the first active layer ACT1, and a second end of the first active layer ACT1 is electrically connected to the data line DL1. In this way, one of the first and second electrodes of the switching transistor T1 may be electrically connected to the data line DL1, while the other of the first and second electrodes of the switching transistor T1 may be electrically connected to the second gate G2 of the driving transistor T2 through the second conductive conversion portion 52.

In some exemplary embodiments of the present disclosure, referring to FIG. 8, the display substrate may also include a second conductive portion 30 in the third conductive layer 3. The second conductive portion 30 includes a conductive main body portion 301, a first conductive connection portion 302, and a second conductive connection portion 303. The first conductive connection portion 302 and the second conductive connection portion 303 protrude outward and extend from the conductive main body portion 301. Referring to FIGS. 3 and 7, the first conductive connection portion 302 is electrically connected to a second end of the second active layer ACT2, and the second conductive connection portion 303 is electrically connected to a first end of the third active layer ACT3. Through the connecting function of the second conductive connection portion 302 and the third conductive connection portion 303, one of the first and second electrodes of the driving transistor T2 may be electrically connected to one of the first and second electrodes of the sensing transistor T3.

In some exemplary embodiments of the present disclosure, referring to FIGS. 3 and 4, the display substrate may also include a first conductive layer 1 on a side of the semiconductor layer facing the base substrate. The display substrate also includes a sensing signal conversion portion 10 in the first conductive layer 1, the sensing signal conversion portion extends in the first direction X, and an orthographic projection of the sensing signal conversion portion 10 on the base substrate partially overlaps with the orthographic projection of the sensing signal line SL on the base substrate.

In some exemplary embodiments of the present disclosure, referring to FIGS. 3 and 5, the third active layer ACT3 of the sensing transistor of the first sub-pixel SP1 and the third active layer ACT3 of the sensing transistor of the second sub-pixel SP2 are connected to form an integrated third active layer ACT3, and the integrated third active layer ACT3 extends in the second direction. The display substrate also includes a third conductive conversion portion 53 in the third conductive layer 3, the sensing signal line SL is electrically connected to the sensing signal conversion portion 10, a first end of the sensing signal conversion portion 10 is electrically connected to a first end of the third conductive conversion portion 53, and a second end of the third conductive conversion portion 53 is electrically connected to a middle part of the third active layer ACT3.

In some exemplary embodiments of the present disclosure, referring to FIGS. 3, 7, and 8, the pixel driving circuit may also include a storage capacitor Cst. The storage capacitor Cst includes a first capacitor Cst1 and a second capacitor Cst2. The second capacitor Cst2 is connected in parallel with the first capacitor Cst1 to increase the capacitance value of the storage capacitor. The display substrate also includes a third conductive portion 11 in the first conductive layer 1. Orthographic projections of any two of the first conductive portion 21, the second conductive portion 30, and the third conductive portion 11 on the base substrate at least partially overlap. The second conductive portion 30 is electrically connected to the third conductive portion 11 through a via hole. An overlapping part of the first conductive portion 21 and the second conductive portion 30 forms the first capacitor Cst1, and an overlapping part of the first conductive portion 21 and the third conductive portion 11 forms the second capacitor Cst2.

Figure 9:
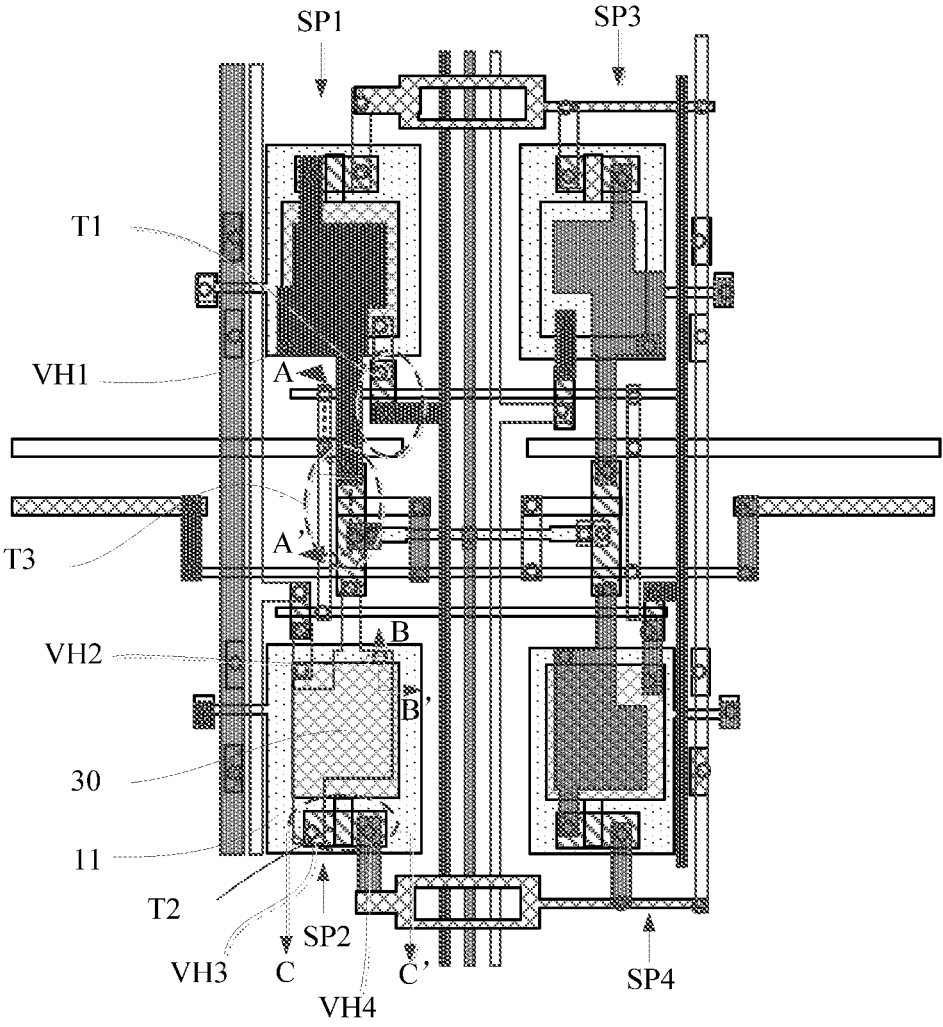
FIG. 9 shows a local plan view of a display substrate according to some embodiments of the present disclosure, which shows a plurality of via holes and lines AA', BB', and CC'.
Figure 10:
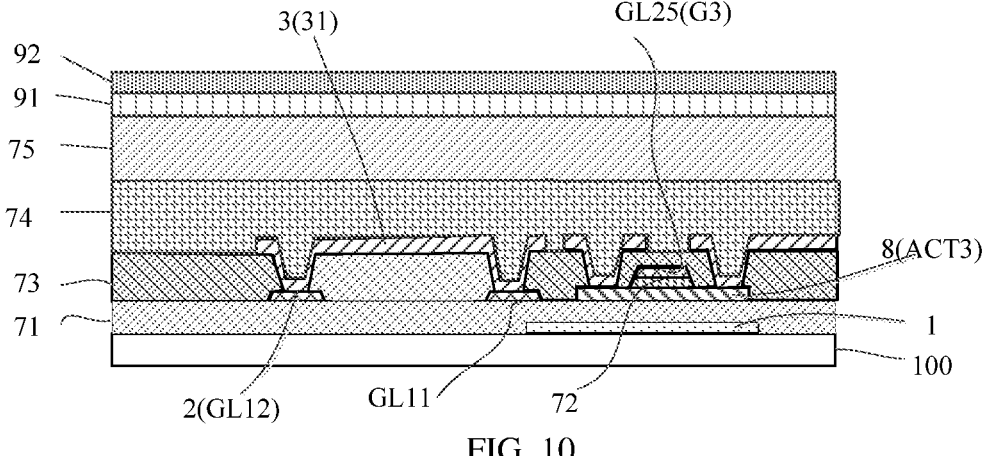
FIG. 10 shows a cross-sectional schematic diagram taken along the line AA' according to FIG. 9.
Figure 11:
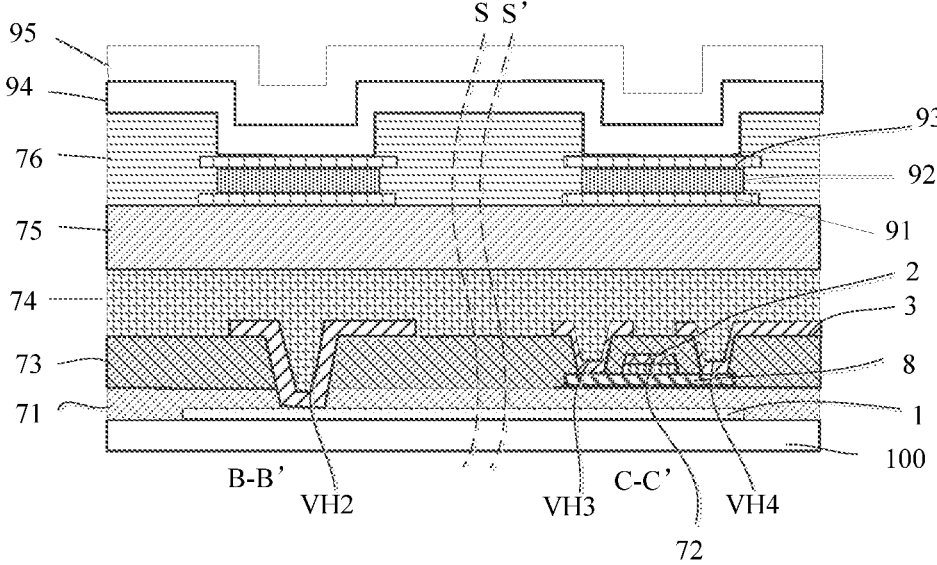
FIG. 11 shows a cross-sectional schematic diagram taken along lines BB' and CC' according to FIG. 9, wherein a region on the left side of SS' is a cross-sectional schematic diagram taken along line BB', and a region on the right side of SS' is a cross-sectional schematic diagram taken along line CC'.

FIG. 9 shows a local plan view of a display substrate according to some embodiments of the present disclosure, which shows a plurality of via holes and lines AA', BB', and CC'. FIG. 10 shows a cross-sectional schematic diagram taken along the line AA'. FIG. 11 shows a cross-sectional schematic diagram taken along lines BB' and CC', where a region on the left side of SS' is a cross-sectional schematic diagram taken along line BB', and a region on the right side of SS' is a cross-sectional schematic diagram taken along line CC'.

For example, FIG. 10 may be a cross-sectional view of a part of the sensing transistor T3 of the first sub-pixel SP1 as well as a part of the first scanning signal conversion portion 31 taken along the line AA'. Referring to FIG. 10, the display substrate may include a base substrate 100, a first conductive layer 1 provided on the base substrate 100, a first insulation layer 71 provided on a side of the first conductive layer 1 away from the base substrate 100, a semiconductor layer 8 provided on a side of the first insulation layer 71 away from the base substrate 100, a second insulation layer 72 provided on a side of the semiconductor layer 8 away from the base substrate 100, a second conductive layer 2 provided on a side of the second insulation layer 72 away from the base substrate 100, a third insulation layer 73 provided on a side of the second conductive layer 2 away from the base substrate 100, a third conductive layer 3 provided on a side of the third insulation layer 73 away from the base substrate 100, a fourth insulation layer 74 provided on a side of the third conductive layer 3 away from the base substrate 100, a fifth insulation layer 75 provided on a side of the fourth insulation layer 74 away from the base substrate 100, a first electrode 91 provided on a side of the fifth insulation layer 75 away from the base substrate 100, and a second electrode 92 provided on a side of the first electrode 91 away from the base substrate 100. In embodiments of the present disclosure, the first sub scanning signal line GL11 and the second sub scanning signal line GL12 are electrically connected through the first scanning signal conversion portion 31. An overlapping region between one of the fifth sub scanning signal lines GL25 and the third active layer ACT3 of the first sub-pixel SP1 forms the third gate G3 of the sensing transistor T3.

For example, the region on the left side of the SS' line in FIG. 11 is a cross-sectional view of a via hole VH2 region at an electrical connection between the second conductive portion 30 and the third conductive portion 11 in the second sub-pixel SP2 taken along line BB'. A region on the right side of the SS' line in FIG. 11 is a cross-sectional view of the driving transistor T2 in the second sub-pixel SP2 taken along line CC'. It should be noted that the SS' region in FIG. 11 is only a schematic structural diagram, and the SS' region may be discontinuous. Referring to FIGS. 9 and 11, the display substrate may include a base substrate 100, a first conductive layer 1 provided on the base substrate 100, a first insulation layer 71 provided on a side of the first conductive layer 1 away from the base substrate 100, a semiconductor layer 8 provided on a side of the first insulation layer 71 away from the base substrate 100, a second insulation layer 72 provided on a side of the semiconductor layer 8 away from the base substrate 100, a second conductive layer 2 provided on a side of the second insulation layer 72 away from the base substrate 100, a third insulation layer 73 provided on a side of the second conductive layer 2 away from the base substrate 100, a third conductive layer 3 provided on a side of the third insulation layer 73 away from the base substrate 100, a fourth insulation layer 74 provided on a side of the third conductive layer 3 away from the base substrate 100, a fifth insulation layer 75 provided on a side of the fourth insulation layer 74 away from the base substrate 100, a first electrode 91 provided on a side of the fifth insulation layer 75 away from the base substrate 100, a second electrode 92 provided on a side of the first electrode 91 away from the base substrate 100, a third electrode 93 provided on a side of the second electrode 92 away from the base substrate 100, a pixel defining layer 76 provided on a side of the third electrode 93 away from the base substrate 100, an organic material layer 94 provided on a side of the pixel defining layer 76 away from the base substrate 100, and a fourth electrode 95 provided on a side of the organic material layer 94 away from the base substrate 100. The first electrode 91, the second electrode 92, and the third electrode 93 may be anodes of the pixel unit. The anode conductivity of the pixel unit may be enhanced through a stacked design, thereby improving the light-emitting efficiency of the pixel unit. The fourth electrode 94 may be the cathode of the pixel unit. Referring to the BB' region in FIG. 11, a part of the third conductive layer 3 may be electrically connected to a part of the first conductive layer 1 through the via hole VH2. Referring to the CC' region in FIG. 1, a part of the third conductive layer 3 may also be contact with a part of the semiconductor layer 8 through via holes VH3 and VH4 to respectively form the source and drain of the driving transistor T2 in the second sub-pixel SP2.

It should be noted that each insulation layer described above may include a single-layer structure or a stack structure composed of a plurality of insulation layers. For example, the fourth insulation layer 74 may include two passivation layers, and the fifth insulation layer 75 may include a passivation layer and a planarization layer.

Referring to FIGS. 3 to 11, in embodiments of the present disclosure, both the driving transistor T2 and the sensing transistor T3 included in the display substrate have a top gate structure. That is, the second gate G2 of the driving transistor T2 is located on a side of the second active layer ACT2 away from the base substrate 100, and the third gate G3 of the sensing transistor T3 is located on a side of the third active layer ACT3 away from the base substrate 100. The driving transistor T2 and the sensing transistor T3 adopt a top gate structure, which may save the distance arrangement in the second direction Y and is conductive to increasing the width of the first scanning signal line, thereby reducing the load on the first scanning signal line and matching a higher refresh rate.

Optionally, embodiments of the present disclosure further provide a display device, which may include the above-described display substrate. The display device may include but is not limited to products or components with display functions, such as an electronic paper, a mobile phone, a tablet computer, a display, a laptop, a digital photo frame, and a navigation device. It should be understood that the display device has the same beneficial effect as the display substrate provided in the above described embodiments.

Although some embodiments of the overall concept of the present disclosure have been shown and explained, those ordinary skilled in the art may understand that changes may be made to these embodiments without departing from the principles and spirit of the overall concept of the present disclosure. The scope of the present disclosure is defined by the claims and their equivalents.

What is claimed is:

1. A display substrate, comprising:
   a base substrate;
   a plurality of pixel units on the base substrate, wherein each of the plurality of pixel units comprises a plurality of sub-pixels, the plurality of pixel units are arranged in an array in a first direction and a second direction on the base substrate, at least one of the plurality of sub-pixels comprises a light-emitting element and a pixel driving circuit configured to drive the light-emitting element, the pixel driving circuit comprises a switching transistor and a sensing transistor, the switching transistor comprises a first gate, the sensing transistor comprises a third gate, and the first direction intersects with the second direction;
   a first scanning signal line on the base substrate, wherein the first scanning signal line is configured to supply a first scanning signal to a first plurality of the pixel units arranged in the first direction;
   a second scanning signal line on the base substrate, wherein the second scanning signal line is configured to supply a second scanning signal to a second plurality of the pixel units arranged in the first direction;
   at least one data line on the base substrate, wherein the at least one data line is configured to supply a data signal to a plurality of the pixel units arranged in the second direction, and the at least one data line extends in the second direction; and
   a sensing signal line on the base substrate, wherein the sensing signal line is configured to supply a sensing signal to the plurality of pixel units arranged in the second direction, and the sensing signal line extends in the second direction,
   wherein the first scanning signal line comprises a plurality of first sub scanning signal lines, the plurality of first sub scanning signal lines extend in the first direction; and the second scanning signal line comprises a plurality of fourth sub scanning signal lines, and the plurality of fourth sub scanning signal lines extend in the first direction, wherein two adjacent first sub scanning signal lines are spaced in a first region, an orthographic projection of the sensing signal line on the base substrate and an orthographic projection of the at least one data line on the base substrate do not overlap with an orthographic projection of the plurality of first sub scanning signal lines on the base substrate, and the orthographic projection of the sensing signal line on the base substrate and the orthographic projection of the at least one data line on the base substrate extend through an orthographic projection of the first region on the base substrate; and two adjacent fourth sub scanning signal lines are spaced in a second region, the orthographic projection of the sensing signal line on the base substrate and the orthographic projection of the at least one data line on the base substrate do not overlap with an orthographic projection of the plurality of fourth sub scanning signal lines on the base substrate, and the orthographic projection of the sensing signal line on the base substrate and the orthographic projection of the at least one data line on the base substrate extend through an orthographic projection of the second region on the base substrate, and wherein the first sub scanning signal line and the first gate are spaced in the second direction, and the fourth sub scanning signal line and the third gate are spaced in the second direction.

2. The display substrate according to claim 1, wherein the display substrate further comprises a first scanning signal conversion portion on the base substrate, and the first scanning signal conversion portion extends in the second direction, and wherein the first sub scanning signal line is electrically connected to the first gate at least through the first scanning signal conversion portion, and the first scanning signal conversion portion and the first sub scanning signal line are in different layers; and/or, the first scanning signal conversion portion and the first gate are in different layers.

3. The display substrate according to claim 2, wherein the first scanning signal line further comprises a second sub scanning signal line, the second sub scanning signal line extends in the first direction, and the second sub scanning signal line and the first sub scanning signal line are spaced in the second direction, and wherein the first sub scanning signal line is electrically connected to the second sub scanning signal line through the first scanning signal conversion portion.

4. The display substrate according to claim 3, wherein the first scanning signal line further comprises a third sub scanning signal line, the third sub scanning signal line extends in the first direction, and the third sub scanning signal line and the first sub scanning signal line are spaced in the second direction, and wherein the first sub scanning signal line is electrically connected to the third sub scanning signal line through the first scanning signal conversion portion.

5. The display substrate according to claim 4, wherein the orthographic projection of the sensing signal line on the base substrate and the orthographic projection of the at least one data line on the base substrate overlap with an orthographic projection of at least one second sub scanning signal line on the base substrate; and/or, wherein the orthographic projection of the sensing signal line on the base substrate and the orthographic projection of the at least one data line on the base substrate overlap with an orthographic projection of at least one third sub scanning signal line on the base substrate.

6. The display substrate according to claim 2, wherein one of the two adjacent first sub scanning signal lines is electrically connected to a first end of a second sub scanning signal line and a first end of a third sub scanning signal line through the first scanning signal conversion portion; and/or, wherein the display substrate further comprises a second scanning signal conversion portion on the base substrate, the second scanning signal conversion portion extends in the second direction, and the other of the two adjacent first sub scanning signal lines is electrically connected to a second end of the second sub scanning signal line and a second end of the third sub scanning signal line through the second scanning signal conversion portion.

7. The display substrate according to claim 6, wherein an orthographic projection of one of two adjacent fifth sub scanning signal lines on the base substrate partially overlaps with an orthographic projection of a third active layer of the first sub-pixel on the base substrate, an orthographic projection of the other of the two adjacent fifth sub scanning signal lines on the base substrate partially overlaps with an orthographic projection of a third active layer of the third sub-pixel on the base substrate, and a part of the fifth sub scanning signal line overlapping with the third active layer of the first sub-pixel and a part of the fifth sub scanning signal line overlapping with the third active layer of the third sub-pixel form a third gate of a sensing transistor of the first sub-pixel and a third gate of a sensing transistor of the third sub-pixel, respectively, wherein an orthographic projection of the sixth sub scanning signal line on the base substrate partially overlaps with an orthographic projection of a third active layer of the second sub-pixel on the base substrate and an orthographic projection of a third active layer of the fourth sub-pixel on the base substrate, and a part of the sixth sub scanning signal line overlapping with the third active layer of the second sub-pixel and a part of the sixth sub scanning signal line overlapping with the third active layer of the fourth sub-pixel form a third gate of a sensing transistor of the second sub-pixel and a third gate of a sensing transistor of the fourth sub-pixel, respectively, wherein the display substrate further comprises a fifth scanning signal conversion portion and a sixth scanning signal conversion portion on the base substrate, and the fifth scanning signal conversion portion and the sixth scanning signal conversion portion extend in the second direction, wherein a first end of the third scanning signal conversion portion is electrically connected to the fourth sub scanning signal line, and a second end of the third scanning signal conversion portion is electrically connected to a first end of the sixth sub scanning signal line, wherein a first end of the fourth scanning signal conversion portion is electrically connected to a first middle part of the sixth sub scanning signal line, and a second end of the fourth scanning signal conversion portion is electrically connected to a first end of the fifth sub scanning signal line;

wherein a first end of the fifth scanning signal conversion portion is electrically connected to a second middle part of the sixth sub scanning signal line, and a second end of the fifth scanning signal conversion portion is electrically connected to a first end of another fifth sub scanning signal line, and wherein a first end of the sixth scanning signal conversion portion is electrically connected to another fourth sub scanning signal line, and a second end of the sixth scanning signal conversion portion is electrically connected to a second end of the sixth sub scanning signal line.

8. The display substrate according to claim 1, wherein the display substrate further comprises a fourth scanning signal conversion portion on the base substrate, and the fourth scanning signal conversion portion extends in the second direction, wherein the fourth sub scanning signal line is electrically connected to the third gate at least through the fourth scanning signal conversion portion, and wherein the fourth scanning signal conversion portion and the fourth sub scanning signal line are in different layers; and/or, the fourth scanning signal conversion portion and the third gate are in different layers.

9. The display substrate according to claim 8, wherein at least one of the plurality of pixel units comprises a first sub-pixel, a second sub-pixel, a third sub-pixel, and a fourth sub-pixel, the first sub-pixel is in a $i^{th}$ row and a $j^{th}$ column, the second sub-pixel is in a $(i+1)^{th}$ row and the $j^{th}$ column, the third sub-pixel is in the $i^{th}$ row and a $(j+1)^{th}$ column, the fourth sub-pixel is in a $(i+1)^{th}$ row and the $(j+1)^{th}$ column, and both i and j are positive integers greater than or equal to 1, and wherein in the second direction, the first sub scanning signal line, the second sub scanning signal line, the third sub scanning signal line, the fourth scanning signal line, the fifth scanning signal line, and the sixth scanning signal line configured to supply scanning signals to sub-pixels in the $i^{th}$ row and sub-pixels in the $(i+1)^{th}$ row are between the sub-pixels in the $i^{th}$ row and the sub-pixels in the $(i+1)^{th}$ row.

10. The display substrate according to claim 9, wherein an orthographic projection of the second sub scanning signal line on the base substrate partially overlaps with an orthographic projection of a first active layer of the first sub-pixel on the base substrate and an orthographic projection of a first active layer of the third sub-pixel on the base substrate, and a part of the second sub scanning signal line overlapping with the first active layer of the first sub-pixel and a part of the second sub scanning signal line overlapping with the first active layer of the third sub-pixel form a first gate of a switching transistor of the first sub-pixel and a first gate of a switching transistor of the third sub-pixel, respectively.

11. The display substrate according to claim 10, wherein an orthographic projection of the third sub scanning signal line on the base substrate partially overlaps with an orthographic projection of a first active layer of the second sub-pixel on the base substrate and an orthographic projection of a first active layer of the fourth sub-pixel on the base substrate, and a part of the third sub scanning signal line overlapping with the first active layer of the second sub-pixel and a part of the third sub scanning signal line overlapping with the first active layer of the fourth sub-pixel form a first gate of a switching transistor of the second sub-pixel and a first gate of a switching transistor of the fourth sub-pixel, respectively.

12. The display substrate according to claim 9, wherein:

in the second direction, the second sub scanning signal line is between the sub-pixels in the $i^{th}$ row and the first sub scanning signal line; and/or, in the second direction, the third sub scanning signal line is between the first sub scanning signal line and the sub-pixels in the $(i+1)^{th}$ row; and/or, in the second direction, the fourth sub scanning signal line is between the first sub scanning signal line and the sub-pixels in the $(i+1)^{th}$ row; and/or, in the second direction, the fourth sub scanning signal line is aligned with the fifth sub scanning signal line; and/or, in the second direction, the sixth sub scanning signal line is between the fourth sub scanning signal line and the third sub scanning signal line, and wherein:

in the first direction, the first scanning signal conversion portion is between the third scanning signal conversion portion and the fourth scanning signal conversion portion; and/or, in the first direction, the fourth scanning signal conversion portion is between the first scanning signal conversion portion and the data line; and/or, in the first direction, the fifth scanning signal conversion portion is between another data line and the second scanning signal conversion portion; and/or, in the first direction, the sixth scanning signal conversion portion is on a side of the first power signal line away from the second scanning signal conversion portion.

13. The display substrate according to claim 1, wherein the second scanning signal line further comprises a plurality of fifth sub scanning signal lines, and the plurality of fifth sub scanning signal lines extend in the first direction, wherein the display substrate further comprises: a second power signal line on the base substrate, the second power signal line is configured to supply a second power signal to the plurality of pixel units arranged in the second direction, and the second power signal line extends in the second direction, and wherein adjacent fourth and fifth sub scanning signal lines are spaced in a third region, an orthographic projection of the second power signal line on the base substrate does not overlap with an orthographic projection of the plurality of fourth sub scanning signal lines on the base substrate, the orthographic projection of the second power signal line on the base substrate does not overlap with an orthographic projection of the plurality of fifth sub scanning signal lines on the base substrate, and the orthographic projection of the second power signal line on the base substrate extends through an orthographic projection of the third region on the base substrate.

14. The display substrate according to claim 13, wherein the display substrate further comprises: a first power signal line on the base substrate, the first power signal line is configured to supply a first power signal to the plurality of pixel units arranged in the second direction, and the first power signal line extends in the second direction, and wherein adjacent fourth and fifth sub scanning signal lines are spaced in a fourth region, an orthographic projection of the first power signal line on the base substrate does not overlap with the orthographic projection of the plurality of fourth sub scanning signal lines on the base substrate, the orthographic projection of the first power signal line on the base substrate does not overlap with the orthographic projection of the plurality of fifth sub scanning signal lines on the base substrate, and the orthographic projection of the first power signal line on the base substrate extends through an orthographic projection of the fourth region on the base substrate.

15. The display substrate according to claim 14, wherein the plurality of fifth sub scanning signal lines are between two adjacent fourth sub scanning signal lines, the plurality of fifth sub scanning signal lines between the two adjacent fourth sub scanning signal lines are spaced in the second region, and the orthographic projection of the sensing signal line on the base substrate and the orthographic projection of the at least one data line on the base substrate do not overlap with the orthographic projection of the plurality of fifth sub scanning signal lines on the base substrate.

16. The display substrate according to claim 13, wherein the second scanning signal line further comprises a sixth sub scanning signal line, the sixth sub scanning signal line extends in the first direction, and the sixth sub scanning signal line and the fourth sub scanning signal line are spaced in the second direction, wherein the display substrate further comprises a third scanning signal conversion portion on the base substrate, and the third scanning signal conversion portion extends in the second direction, and wherein the fourth sub scanning signal line is electrically connected to the sixth sub scanning signal line through the third scanning signal conversion portion.

17. The display substrate according to claim 16, wherein the sixth sub scanning signal line is electrically connected to the fifth sub scanning signal line through the fourth scanning signal conversion portion.

18. The display substrate according to claim 16, wherein the orthographic projection of the sensing signal line on the base substrate and the orthographic projection of the at least one data line on the base substrate overlap with an orthographic projection of at least one sixth sub scanning signal line on the base substrate.

19. The display substrate according to claim 1, wherein the display substrate comprises:

a semiconductor layer on the base substrate, wherein the first active layer and the third active layer are in the semiconductor layer;

a second conductive layer on a side of the semiconductor layer away from the base substrate; and a third conductive layer on a side of the second conductive layer away from the base substrate, wherein the first sub scanning signal line, the second sub scanning signal line, the third sub scanning signal line, the fourth scanning signal line, the fifth scanning signal line, and the sixth scanning signal line are in the second conductive layer, and the first scanning signal conversion portion, the second scanning signal conversion portion, the third scanning signal conversion portion, the fourth scanning signal conversion portion, the fifth scanning signal conversion portion, and the sixth scanning signal conversion portion are in the third conductive layer;

wherein the display substrate further comprises a first conductive portion in the second conductive layer, the pixel driving circuit further comprises a driving transistor, the driving transistor comprises a second active layer, an orthographic projection of the first conductive portion on the base substrate partially overlaps with an orthographic projection of the second active layer on the base substrate, and a part of the first conductive portion overlapping with the second active layer forms a second gate of the driving transistor;

wherein the display substrate further comprises a first conductive conversion portion in the third conductive layer and a first power signal conversion portion in the second conductive layer, a first end of the first power signal conversion portion is electrically connected to the first power signal line, a second end of the first power signal conversion portion is electrically connected to a first end of the first conductive conversion portion, and a second end of the first conductive conversion portion is electrically connected to a first end of the second active layer;

wherein the display substrate further comprises a second conductive conversion portion in the third conductive layer, a first end of the second conductive conversion portion is electrically connected to the first conductive portion, a second end of the second conductive conversion portion is electrically connected to a first end of the first active layer, and a second end of the first active layer is electrically connected to the data line;

wherein the display substrate further comprises a second conductive portion in the third conductive layer, the second conductive portion comprises a conductive main body portion, a first conductive connection portion, and a second conductive connection portion, and the first conductive connection portion and the second conductive connection portion protrude outward and extend from the conductive main body portion;

wherein the first conductive connection portion is electrically connected to a second end of the second active layer, and the second conductive connection portion is electrically connected to a first end of the third active layer;

wherein the display substrate further comprises a first conductive layer on a side of the semiconductor layer facing the base substrate; the display substrate further comprises a sensing signal conversion portion in the first conductive layer, the sensing signal conversion portion extends in the first direction, and an orthographic projection of the sensing signal conversion portion on the base substrate partially overlaps with the orthographic projection of the sensing signal line on the base substrate;

wherein a third active layer of a sensing transistor of the first sub-pixel and a third active layer of a sensing transistor of the second sub-pixel are connected to form an integrated third active layer, and the integrated third active layer extends in the second direction;

wherein the display substrate further comprises a third conductive conversion portion in the third conductive layer, the sensing signal line is electrically connected to the sensing signal conversion portion, a first end of the sensing signal conversion portion is electrically connected to a first end of the third conductive conversion portion, and a second end of the third conductive conversion portion is electrically connected to a middle part of the third active layer;

wherein the pixel driving circuit further comprises a storage capacitor, the storage capacitor comprises a first capacitor and a second capacitor, and the second capacitor is connected in parallel with the first capacitor; and wherein the display substrate further comprises a third conductive portion in the first conductive layer, orthographic projections of any two of the first conductive portion, the second conductive portion, and the third
conductive portion on the base substrate at least par-
tially overlap; and wherein the second conductive portion is electrically
connected to the third conductive portion, an overlapping part of the first conductive portion and the second
conductive portion forms the first capacitor, and an
overlapping part of the first conductive portion and the
third conductive portion forms the second capacitor.

20. A display device comprising the display substrate according to claim 1.

\* \* \* \* \*